(12) United States Patent
Xie et al.

(10) Patent No.: US 12,507,437 B2
(45) Date of Patent: Dec. 23, 2025

(54) DIRECT BACKSIDE SELF-ALIGNED CONTACT

(71) Applicant: International Business Machines Corporation, Armonk, NY (US)

(72) Inventors: Ruilong Xie, Niskayuna, NY (US); Julien Frougier, Albany, NY (US); Chen Zhang, Guilderland, NY (US); Min Gyu Sung, Latham, NY (US); Heng Wu, Santa Clara, CA (US)

(73) Assignee: International Business Machines Corporation, Armonk, NY (US)

( * ) Notice: Subject to any disclaimer, the term of this patent is extended or adjusted under 35 U.S.C. 154(b) by 546 days.

(21) Appl. No.: 17/967,428

(22) Filed: Oct. 17, 2022

(65) Prior Publication Data

US 2024/0128333 A1    Apr. 18, 2024

(51) Int. Cl.

| | |
|---|---|
| H10D 30/67 | (2025.01) |
| H01L 21/762 | (2006.01) |
| H10D 30/01 | (2025.01) |
| H10D 30/43 | (2025.01) |
| H10D 64/01 | (2025.01) |
| H01L 21/3065 | (2006.01) |
| H01L 23/528 | (2006.01) |
| H10D 62/10 | (2025.01) |

(52) U.S. Cl.
CPC ... *H10D 30/6729* (2025.01); *H01L 21/76283* (2013.01); *H10D 30/014* (2025.01); *H10D 30/031* (2025.01); *H10D 30/43* (2025.01); *H10D 64/01* (2025.01); *H01L 21/3065* (2013.01); *H01L 23/5286* (2013.01); *H10D 30/6735* (2025.01); *H10D 62/118* (2025.01)

(58) Field of Classification Search
CPC .............. H01L 23/5286; H01L 23/528; H10D 30/6729

See application file for complete search history.

(56) References Cited

U.S. PATENT DOCUMENTS

| 9,570,395 B1 | 2/2017 | Sengupta et al. |
| 10,586,765 B2 | 3/2020 | Smith et al. |

(Continued)

FOREIGN PATENT DOCUMENTS

| CN | 112750824 A | 5/2021 |
| WO | 1999052137 A1 | 10/1999 |
| WO | 2024/082734 A1 | 4/2024 |

OTHER PUBLICATIONS

Mathur, R., et al., "Buried Bitline for sub-5nm SRAM Design", 2020 IEEE International Electron Devices Meeting (IEDM), Date of Conference: Dec. 12-18, 2020, 4 pages.

(Continued)

*Primary Examiner* — Wasiul Haider
(74) *Attorney, Agent, or Firm* — Scully, Scott, Murphy & Presser, P.C.; Samuel Waldbaum

(57) ABSTRACT

A semiconductor structure is provided including a backside source/drain contact structure that contacts a source/drain region of a transistor and overlaps a portion of a tri-layered bottom dielectric isolation structure that is located on a backside of the transistor. The presence of the tri-layered bottom dielectric isolation structure prevents shorting between the gate structure of the transistor and the backside source/drain contact structure, and thus improves process margin.

19 Claims, 30 Drawing Sheets

Section Y1

(56) References Cited

U.S. PATENT DOCUMENTS

| | | | |
|---|---|---|---|
| 10,636,739 B2 | 4/2020 | Beyne et al. | |
| 10,700,207 B2 | 6/2020 | Chen et al. | |
| 11,183,558 B2 | 11/2021 | Yeh et al. | |
| 11,189,713 B2 | 11/2021 | Xie et al. | |
| 11,289,606 B2 | 3/2022 | Ju et al. | |
| 2012/0133024 A1 | 5/2012 | Prechtl et al. | |
| 2017/0221891 A1* | 8/2017 | Chen | H10D 30/024 |
| 2020/0105671 A1 | 4/2020 | Lai et al. | |
| 2021/0104440 A1 | 4/2021 | Miller et al. | |
| 2021/0202385 A1 | 7/2021 | Huang et al. | |
| 2021/0335783 A1* | 10/2021 | Chiu | H10D 30/6735 |
| 2021/0376093 A1 | 12/2021 | Chu et al. | |
| 2021/0399109 A1 | 12/2021 | Su et al. | |
| 2022/0037496 A1 | 2/2022 | Chen et al. | |
| 2022/0069116 A1 | 3/2022 | Chen et al. | |
| 2022/0093512 A1 | 3/2022 | Chang et al. | |
| 2022/0165659 A1 | 5/2022 | Huang et al. | |
| 2022/0310638 A1 | 9/2022 | Cheng et al. | |

OTHER PUBLICATIONS

Prasad, D., et al., "Buried Power Rails and Back-side Power Grids: Arm CPU Power Delivery Network Design Beyond 5nm", 2019 IEEE International Electron Devices Meeting (IEDM), Date of Conference: Dec. 7-11, 2019, 4 pages.

International Search Report and Written Opinion dated Sep. 22, 2023, received in a corresponding foreign application, 9 pages.

\* cited by examiner

Section Y1

Section Y1

Section Y2

Section Y1

Section Y1

Section Y1

Section Y1

Section Y2

Section Y1

Section Y1

Section Y1

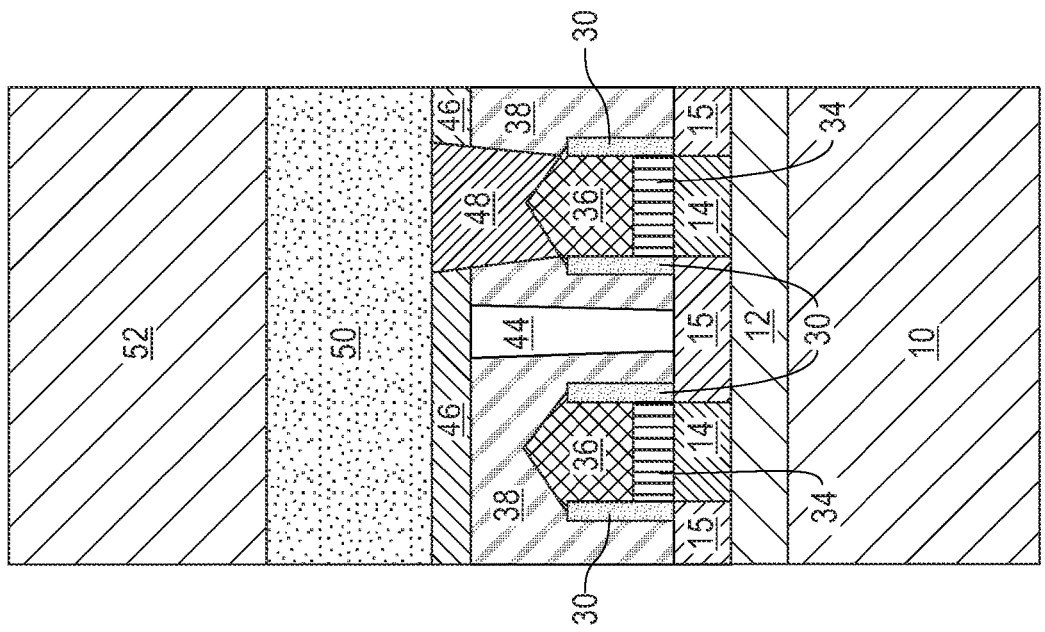
FIG. 10C Section Y2
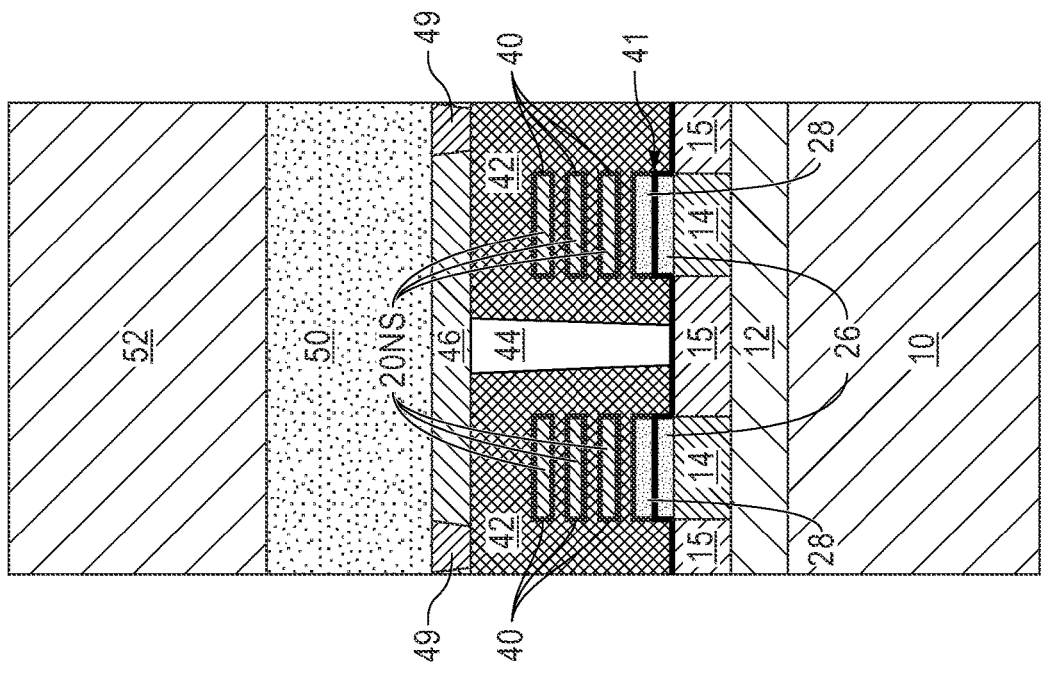
FIG. 10B Section Y1

Section Y1

Section Y1

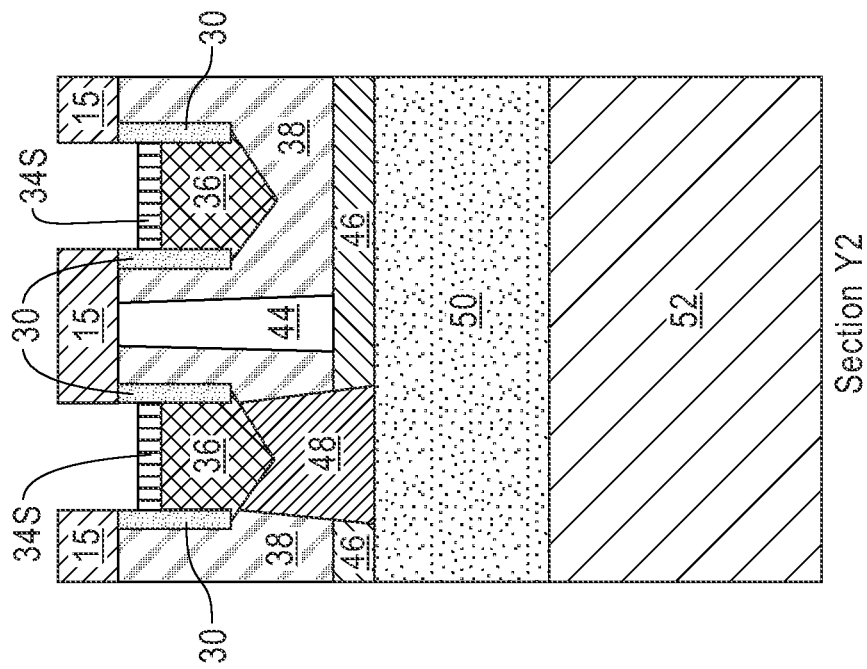
FIG. 13C  Section Y2
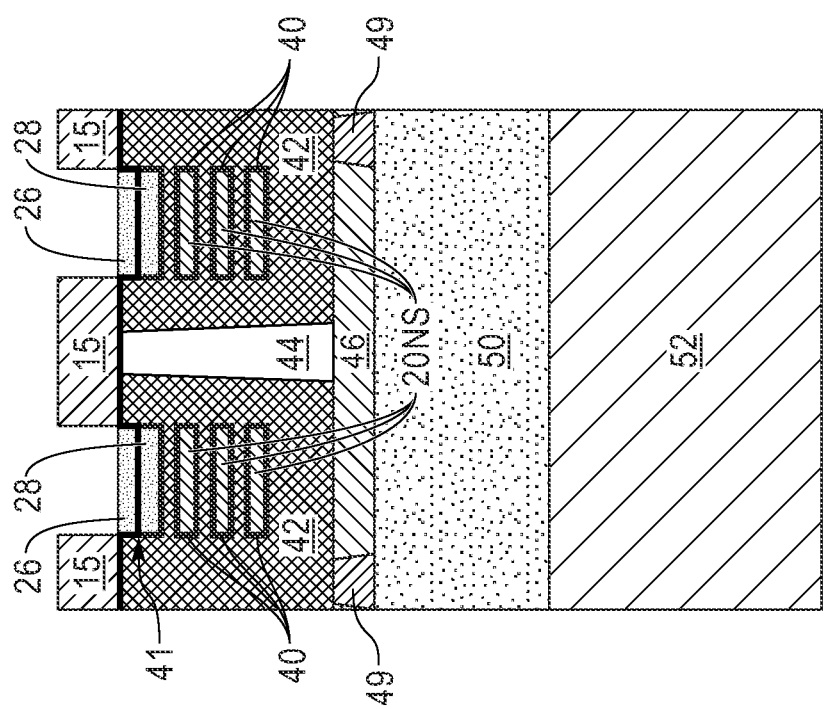
FIG. 13B  Section Y1

Section Y1

Section Y1

DIRECT BACKSIDE SELF-ALIGNED CONTACT

BACKGROUND

The present application relates to semiconductor technology, and more particularly to a semiconductor structure including a self-aligned backside source-drain contact structure as well as a method of forming the same.

Integrated circuitry continues to scale to smaller feature dimensions and higher transistor densities. Three-dimensional (3D) integration increases transistor density by exploiting the Z-dimension, building upwards as well as building laterally outwards in the X and Y dimensions. Another development that can be used for increasingly densely packed semiconductor devices is to establish electrical connections between semiconductor devices using both front side and backside connections. Regardless of whether an integrated circuit includes one device layer (or equivalently "device region") or multiple device layers, using backside connections can improve various aspects of semiconductor device configuration and performance, particularly with respect to density constraints.

SUMMARY

A semiconductor structure is provided including a backside source/drain contact structure that contacts a source/drain region of a transistor and overlaps a portion of a tri-layered bottom dielectric isolation structure that is located on a backside of the transistor. The backside source/drain contact is self-aligned. The presence of the tri-layered bottom dielectric isolation structure prevents shorting between the gate structure of the transistor and the backside source/drain contact structure, and thus improves process margin.

In one aspect of the present application, a semiconductor structure is provided. In one embodiment, the semiconductor structure includes a transistor including a gate structure and a first source/drain region located on a first side of the gate structure and a second source/drain region located on a second side of the gate structure. The structure further includes a tri-layered bottom dielectric isolation structure located beneath the transistor, a backside power rail located beneath, and spaced apart from, the tri-layered bottom dielectric isolation structure, and a backside source/drain contact structure connecting the backside power rail to the first source/drain region of the transistor. In accordance with the present application, the backside source/drain contact structure overlaps (i.e., vertically) at least a portion of the tri-layered bottom dielectric isolation structure. The presence of the tri-layered bottom dielectric isolation structure provides a thick dielectric cap that prevents backside source/drain contact structure from shorting the gate structure. In the prior art, bottom isolation structures are thin structures, typically less, than 10 nm, thus shorting between the gate structure and the backside source/drain contact structure can occur.

In embodiments of the present application, the tri-layered bottom dielectric isolation structure includes a first bottom dielectric isolation layer, a second bottom dielectric isolation layer and a third bottom dielectric isolation layer, wherein the first bottom dielectric isolation layer and the third bottom dielectric isolation layer are both composed of a first dielectric material, and the second bottom dielectric isolation layer is composed of a second dielectric material that is compositionally different from the first dielectric material. In the present application, the second bottom dielectric isolation layer is sandwiched between the first and third bottom dielectric isolation layers. The different dielectric materials provide etch selectivity to the structure which enables an etch used to form a backside source/drain contact opening that houses the backside source/drain contact structure to stop at the second bottom dielectric isolation layer thus preventing exposure of the gate structure.

In embodiments of the present application, the first dielectric material includes a low-k spacer dielectric material (i.e., dielectric constant of less than 5.5), and the second dielectric material comprises a high-k gate dielectric material (i.e., dielectric constant of 4.0 or greater). This provides the etch selectivity mentioned above.

In embodiments of the present application, the structure further includes a gate spacer located on a sidewall of the gate structure, wherein the gate spacer is composed of the first dielectric material. This aspect of the present application is related to the process in which the gate spacer, the first bottom dielectric isolation layer and the third bottom dielectric isolation layer are formed at a same time.

In embodiments of the present application, the gate structure includes a gate dielectric material layer, wherein the gate dielectric material layer is composed of the second dielectric material. This aspect of the present application is related to the process in which the gate dielectric material layer and the second bottom dielectric isolation layer are formed at a same time.

In embodiments of the present application, the backside source/drain contact structure contacts a sidewall of the first bottom dielectric isolation layer, a horizontal surface and a sidewall surface of the second bottom dielectric isolation layer, and a sidewall of the third bottom dielectric isolation layer. This is a result of the different dielectric materials used in forming the tri-layered bottom dielectric isolation structure, and as a result shorting between the gate structure and the backside source/drain contact structure is avoided.

In embodiments of the present application, the structure further includes a semiconductor buffer layer located on a surface of the first source/drain region, wherein the semiconductor buffer layer embeds a portion of the backside source/drain contact structure. The semiconductor buffer layer is used as a growth surface for the source/drain regions which allows for high-quality, as defined later in the present application, source/drain regions to be formed.

In embodiments of the present application, the structure further includes a multilayered backside interlayer dielectric material structure embedding another portion of the backside source/drain contact structure, wherein the multilayered backside interlayer dielectric material structure further embeds the backside power rail.

In embodiments of the present application, the structure further includes a backside power distribution network contacting the backside power rail. The backside power distribution network distributes power to the transistor.

In embodiments of the present application, the structure further includes a front side source/drain contact structure contacting the second source/drain region. The presence of the front side source/drain contact structure allows for the transistor to be connected to other electronic components.

In embodiments of the present application, the front side source/drain contact structure is embedded in a first front side interlayer dielectric material layer and a second front side interlayer dielectric material layer.

In embodiments of the present application, the structure further includes a front side gate contact structure located in the second front side interlayer dielectric material layer and contacting a gate electrode of the gate structure. The presence of the front side gate contact structure allows for the transistor to be connected to other electronic components.

In embodiments of the present application, the structure further includes a front side back-end-of-the-line structure located on the second front side interlayer dielectric material layer, wherein the front side back-end-of-the-line structure is electrically connected to the second source/drain region by the front side source/drain contact structure.

In embodiments of the present application, the structure further includes a carrier wafer located on a surface of the front side back-end-of-the-line structure.

In embodiments of the present application, the transistor is located on one side of a gate cut dielectric pillar. The gate cut dielectric pillar is used to separate one transistor from another transistor.

In embodiments of the present application, the transistor is a nanosheet transistor including a nanosheet stack of suspended semiconductor channel material nanosheets. In such embodiments, the gate structure of the transistor wraps around each of the suspended semiconductor material nanosheets.

In embodiments of the present application, the gate structure of the transistor includes a gate electrode that is located above, and laterally adjacent to, the tri-layered bottom dielectric isolation structure.

In another aspect of the present application, a method of forming a semiconductor structure is provided. The method of the present application includes forming a tri-layered bottom dielectric isolation structure beneath a gate structure of a transistor that includes a first source/drain region located on one side of the gate structure, and a second source/drain region located the second side of the gate structure. Next, a backside source/drain contact structure is formed contacting a surface of the first source/drain region, wherein the forming of the backside source/drain contact structure includes partially etching through the tri-layered bottom dielectric isolation structure. The method improves process margin be eliminating shorting between the gate structure and the backside source/drain contact structure.

BRIEF DESCRIPTION OF THE DRAWINGS

FIGS. 10A, 10B and 10C are cross sectional views of the exemplary structure shown in FIGS. 9A, 9B and 9C, respectively, after forming a front side back-end-of-the-line (BEOL) structure and a carrier wafer.

FIGS. 13A, 13B and 13C are cross sectional views of the exemplary structure shown in FIGS. 12A, 12B and 12C, respectively, after removing the second semiconductor material layer and a portion of the semiconductor buffer layer.

DETAILED DESCRIPTION

Figure 1:
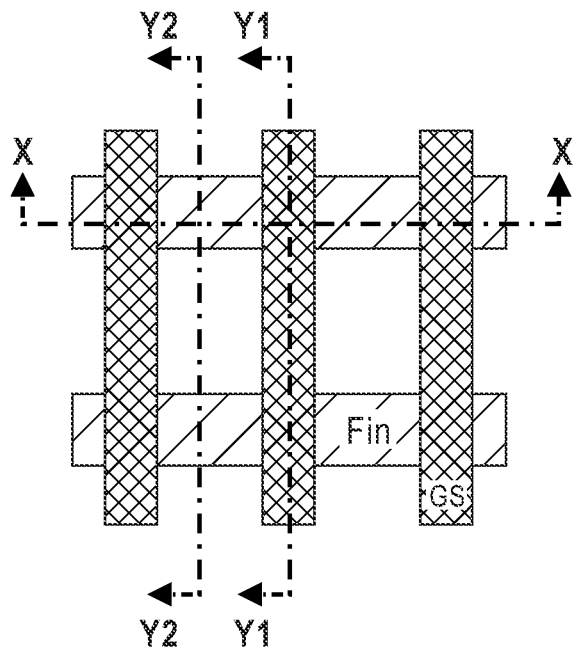
FIG. 1 is a top down view of a device layout that can be used for describing a semiconductor structure in accordance with the present application, the device layout includes a X-X cut which is along a first semiconductor fin structure, a Y1-Y1 cut which is located through a gate structure, and a Y2-Y2 cut which is in a source/drain area that is located between two adjacent gate structures.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Referring first to FIG. 1, there is illustrated a top down view of a device layout that can be used for describing a semiconductor structure in accordance with the present application. The device layout illustrated in FIG. 1 includes three parallelly orientated gate structures, GS, which cross over different portions of two semiconductor fin structures, Fin, which are orientated parallel to each other and perpendicular to each of the gate structures. As used herein, a "Fin" refers to a contiguous structure including one or more semiconductor materials and including a pair of substantially vertical sidewalls that are parallel to each other. As used herein, a surface is "substantially vertical" if there exists a vertical plane from which the surface does not deviate by more than three times the root mean square roughness of the surface. Each Fin can have a vertical height from 15 nm to 100 nm and a width from 4 nm to 100 nm. The device layout includes a X-X cut which is along a first semiconductor fin structure, a Y1-Y1 cut which is located through a gate structure, and a Y2-Y2 cut which is in a source/drain area that is located between two adjacent gate structures. In the present application, each of FIGS. 2A, 3A, 4A, 5A, 6A, 7A, 8A, 9A, 10A, 11A, 12A, 13A, 14A, 15A and 16A are through the X-X cut, each of FIGS. 2B, 3B, 4B, 5B, 6B, 7B, 8B, 9B, 10B, 11B, 12B, 13B, 14B, 15B and 16B are through the Y1-Y1 cut, and each of FIGS. 2C, 3C, 4C, 5C, 6C, 7C, 8C, 9C, 10C, 11C, 12C, 13C, 14C, 15C and 16C are through the Y2-Y2 cut.

It is noted that although the present application describes and illustrates nanosheet-containing transistors, i.e., transistors in which a gate structure is wrapped around a plurality of vertically stacked semiconductor channel material nanosheets, the present application works for other types of transistors such as, for example, planar transistors, fin-type transistors, stacked transistors, or semiconductor nanowire transistors.

In the present application, the term "transistor" is used to describe a device that includes a gate structure that contacts a semiconductor channel material structure and has a first source/drain region located on a first side of the gate structure, and a second source/drain region located on a second side of the gate structure, the second side of the gate structure is opposite the first side of the gate structure.

In the present application, the term "front side" denotes a side of the structure including the transistor that is located above a semiconductor substrate.

In the present application, the term "backside" denotes the side of the structure that is located beneath the transistor after the semiconductor substrate has been removed.

Figure 2A:
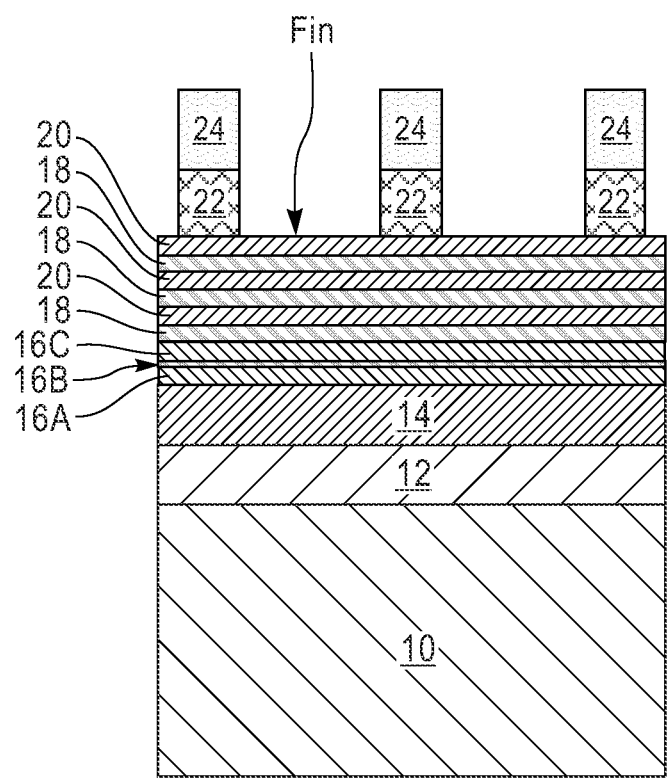
FIGS. 2A, 2B and 2C are cross sectional views through X-X, Y1-Y1 and Y2-Y2 of FIG. 1, respectively, of an exemplary structure that can be employed in the present application, the exemplary structure includes at least one semiconductor fin structure located on a surface of a semiconductor substrate, and at least one sacrificial gate structure located on a surface of the at least semiconductor fin structure, wherein the at least one semiconductor fin structure includes, a first sacrificial semiconductor material layer, a second sacrificial semiconductor material layer, a third sacrificial semiconductor material layer, and a material stack of alternating fourth sacrificial semiconductor material layers and semiconductor channel material layers.
Figure 2C:
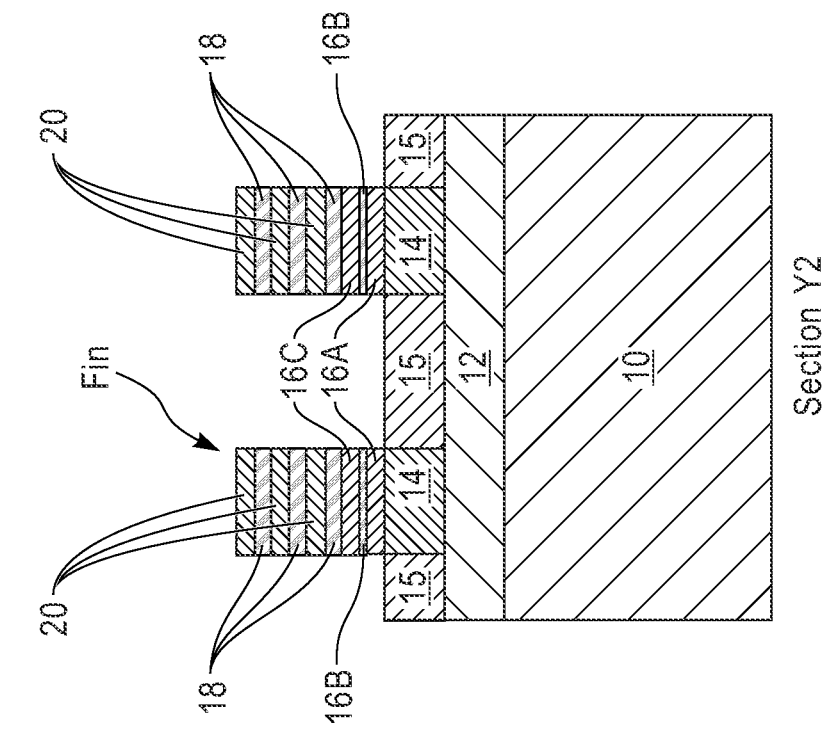
Figure 2B:
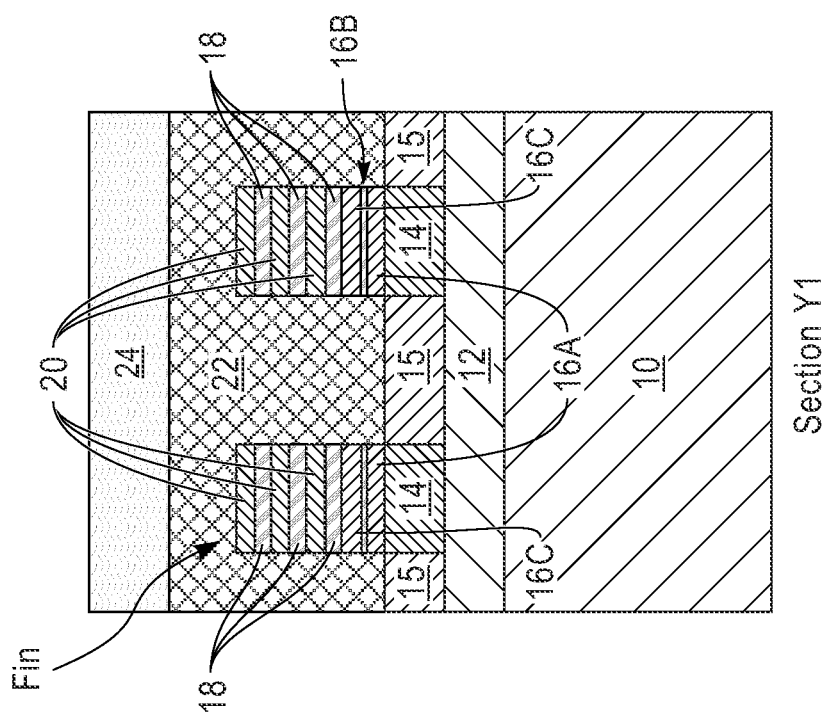

Referring now to FIGS. 2A, 2B and 2C, there are illustrated through X-X, Y1-Y1 and Y2-Y2 of FIG. 1, respectively, an exemplary structure that can be employed in the present application. The exemplary structure illustrated in FIGS. 2A, 2B and 2C includes at least one semiconductor fin structure, Fin, located on a surface of a semiconductor substrate 10/12/14, and at least one sacrificial gate structure 22 (three of which are shown by way of one example) located on a surface of the at least semiconductor fin structure, Fin. In FIGS. 2B and 2C, two Fins are illustrated by way of one example.

The semiconductor substrate 10 includes a first semiconductor material layer 10, an etch stop layer 12, and a second semiconductor material layer 14. An optional sacrificial cap 24 can be located on top of each sacrificial gate structure 22, and a shallow trench isolation structure 15 can be located in an upper portion of the semiconductor substrate 10/12/14. In the illustrated embodiment, the shallow trench isolation structure 15 is formed in the second semiconductor material layer 14 and the shallow trench isolation structure 15 contacts a surface of the etch stop layer 12.

In accordance with the present application, the at least one semiconductor fin structure, Fin, includes, a first sacrificial semiconductor material layer 16A, a second sacrificial semiconductor material layer 16B, a third sacrificial semiconductor material layer 16C, and a material stack of alternating fourth sacrificial semiconductor material layers 18 and semiconductor channel material layers 20. As is illustrated, each semiconductor fin structure, Fin, is located on top of the second semiconductor material layer 14 of the semiconductor substrate 10/12/14.

As mentioned above, the semiconductor substrate includes first semiconductor material layer 10, etch stop layer 12 and second semiconductor material layer 14. The first semiconductor material layer 10 of the semiconductor substrate is composed of a first semiconductor material having semiconducting properties. Examples of first semiconductor materials that can be used to provide the first semiconductor material layer 10 include, but are not limited to, silicon (Si), a silicon germanium (SiGe) alloy, a silicon germanium carbide (SiGeC) alloy, germanium (Ge), III/V compound semiconductors or II/VI compound semiconductors. The second semiconductor material layer 14 of the semiconductor substrate is composed of a second semiconductor material. The second semiconductor material that provides the second semiconductor material layer 14 can be compositionally the same as, or compositionally different from, the first semiconductor material that provides the first semiconductor material layer 10. In some embodiments of the present application, the etch stop layer 12 can be composed of a dielectric material such as, for example, silicon dioxide and/or boron nitride. In other embodiments of the present application, the etch stop layer 12 is composed of a semiconductor material that is compositionally different from the semiconductor material that provides both the first semiconductor material layer 10 and the second semiconductor material layer 14. In one example, the first semiconductor material layer 10 is composed of silicon, the etch stop layer 12 is composed of silicon dioxide, and the second semiconductor material layer 14 is composed of silicon. Such a semiconductor substrate including silicon/silicon dioxide/silicon can be referred to as a silicon-on-insulator (SOI) substrate. In another example, the first semiconductor material layer 10 is composed of silicon, the etch stop layer 12 is composed of silicon germanium, and the second semiconductor material layer 14 is composed of silicon. Such a semiconductor substrate including silicon/silicon germanium/silicon can be referred to as a bulk semiconductor substrate.

The shallow trench isolation structure 15 is composed of any trench dielectric material such as, for example, silicon oxide. In some embodiments, a trench dielectric material such as, for example, SiN, can be present along a sidewall and a bottom wall of the trench dielectric material. As is shown in FIGS. 2B and 2C, the shallow trench isolation structure 15 is located laterally adjacent to a non-etched portion of the second semiconductor material layer 14 of the semiconductor substrate.

The first sacrificial semiconductor material layer 16A and the third sacrificial semiconductor layer 16C are both composed of a third semiconductor material that is compositionally different from the second semiconductor material that provides the second semiconductor material layer 14 of the semiconductor substrate, a fourth semiconductor material that provides the second sacrificial semiconductor material layer 16B and each fourth sacrificial semiconductor material layer 18 and a fifth semiconductor material that provides each semiconductor channel material layer 20. In one example, the third semiconductor material that provides the first sacrificial semiconductor material layer 16A and the third sacrificial semiconductor layer 16C is composed of a silicon germanium alloy having a germanium content of 55 atomic percent, the fourth semiconductor material that provides the second sacrificial semiconductor material layer 16B and each fourth sacrificial semiconductor material layer 18 is composed of a silicon germanium alloy having a germanium content of 30 atomic percent, and the fifth semiconductor material that process each semiconductor channel material layer 20 is composed of silicon. The fifth semiconductor material that provides each semiconductor channel material layer 20 can be compositionally the same as, or compositionally different from, the second semiconductor material that provides the second semiconductor material layer 14.

In the present application, the first sacrificial semiconductor material layer 16A and the third sacrificial semiconductor layer 16C can have a thickness from 6 nm to 15 nm, the second sacrificial semiconductor layer 16B can have a thickness from 1 nm to 5 nm, each fourth sacrificial semiconductor material layer 18 can have a thickness of 4 nm to 15 nm (note that the thickness of the second sacrificial semiconductor material layer 16B is less than the thickness of each of the fourth sacrificial semiconductor material layer 18), and each semiconductor channel material layer 20 can have a thickness from 4 nm to 12 nm. The width and length of each of these layers has been defined above (see, the width and length mentioned for the Fin).

Each sacrificial gate structure 22 includes at least a sacrificial gate material. In some embodiments, each sacrificial gate structure 22 can include a sacrificial gate dielectric material. The sacrificial gate dielectric material can be composed of a dielectric material such as, for example, silicon dioxide. The sacrificial gate material can include, but is not limited to, polysilicon, amorphous silicon, amorphous silicon germanium or amorphous germanium.

Each sacrificial cap 24 can be composed of a dielectric hard mask material such as, for example, silicon nitride and/or silicon oxynitride. In the illustrated embodiment, each sacrificial cap 24 has a sidewall that is vertically aligned to the sidewall of one of the sacrificial gate structures 22. In embodiments, the sacrificial caps 24 can be omitted from the exemplary structure. Note that within the source/drain cross section shown in FIG. 2C, no sacrificial gate structure 22 or sacrificial cap 24 is present.

The exemplary structure shown in FIGS. 2A-2C can be formed utilizing fin forming processing techniques that are well known to those skilled in the art. For example, and after providing the semiconductor substrate 10/12/14, a blanket layer of the third semiconductor material used to provide the first sacrificial semiconductor material layer 16A, a blanket layer of the fourth semiconductor material used to provide the second sacrificial semiconductor layer 16B, and a blanket layer of the third semiconductor material used to provide the third sacrificial semiconductor material layer 16C are formed by one or more deposition processes such as, for example, chemical vapor deposition (CVD), plasma enhanced chemical vapor deposition (PECVD), or epitaxial growth. The terms "epitaxial growth" or "epitaxially growing" means the growth of a second semiconductor material on a growth surface of a first semiconductor material, in which the second semiconductor material being grown has the same crystalline characteristics as the first semiconductor material. In an epitaxial deposition process, the chemical reactants provided by the source gases are controlled and the system parameters are set so that the depositing atoms arrive at the growth surface of the first semiconductor material with sufficient energy to move around on the growth surface and orient themselves to the crystal arrangement of the atoms of the growth surface. Examples of various epitaxial growth process apparatuses that can be employed in the present application include, e.g., rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). The temperature for epitaxial deposition typically ranges from 550° C. to 900° C. Although higher temperature typically results in faster deposition, the faster deposition may result in crystal defects and film cracking.

Next, a blanket material stack of alternating blanket layers of the fourth semiconductor material used to provide each fourth sacrificial semiconductor material layer 18 and the fifth semiconductor material used to provide each semiconductor channel material layer 20 is formed. This blanket material stack can be formed by one or more deposition processes including, for example, CVD, PECVD or epitaxial growth. This blanket material stack and the underling blanket material layers can then be patterned by lithography and etching to provide a Fin structure including the first sacrificial semiconductor material layer 16A, the second sacrificial semiconductor material layer 16B, the third sacrificial semiconductor material layer 16C, and the alternating fourth sacrificial semiconductor material layers 18 and semiconductor channel material layers 20 as shown in FIGS. 2A-2C. Next, the shallow trench isolation structure 15 is formed utilizing techniques well-known to those skilled in the art. Next, a blanket layer of sacrificial gate structure material and a blanket layer of hard mask material are formed by deposition processes such as, for example, CVD, PECVD, physical vapor deposition (PVD) or atomic layer deposition (ALD). The blanket layers of hard mask material and sacrificial gate structure material are then patterned by lithography and etching to provide the sacrificial caps 24 and the sacrificial gate structures 22 mentioned above.

Figure 3A:
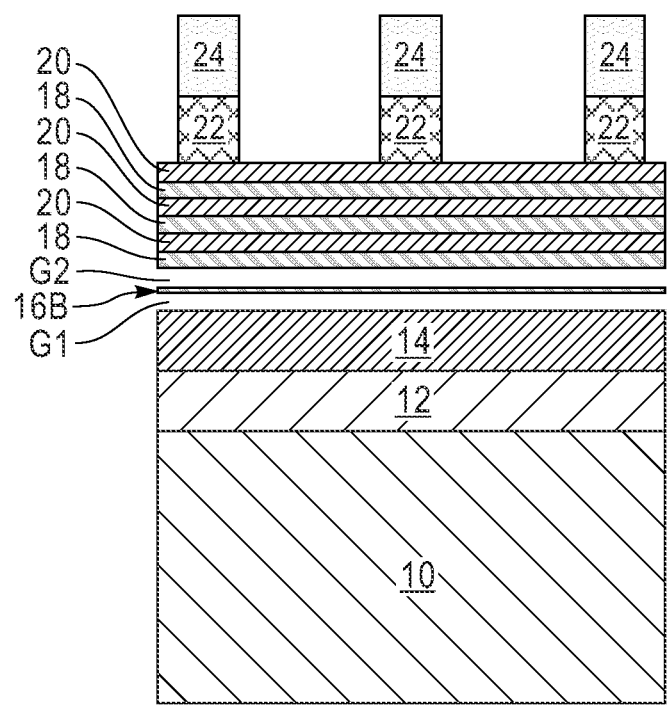
FIGS. 3A, 3B and 3C are cross sectional views of the exemplary structure shown in FIGS. 2A, 2B and 2C, respectively, after removing the first sacrificial semiconductor material layer to form a first gap and the third sacrificial semiconductor material layer to form a second gap, wherein the first gap and the second gap are spaced apart by the second sacrificial semiconductor material layer.
Figure 3C:
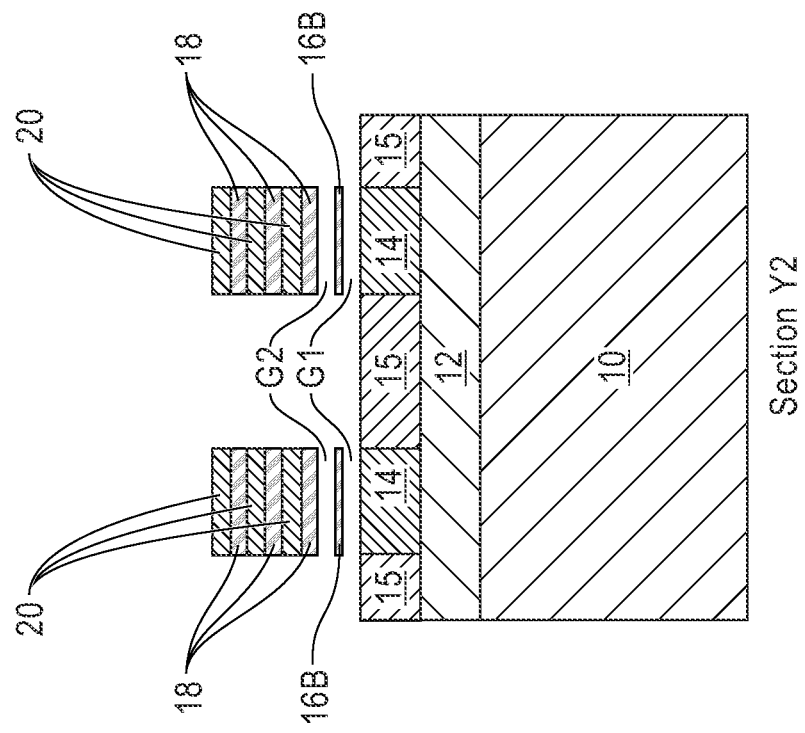
Figure 3B:
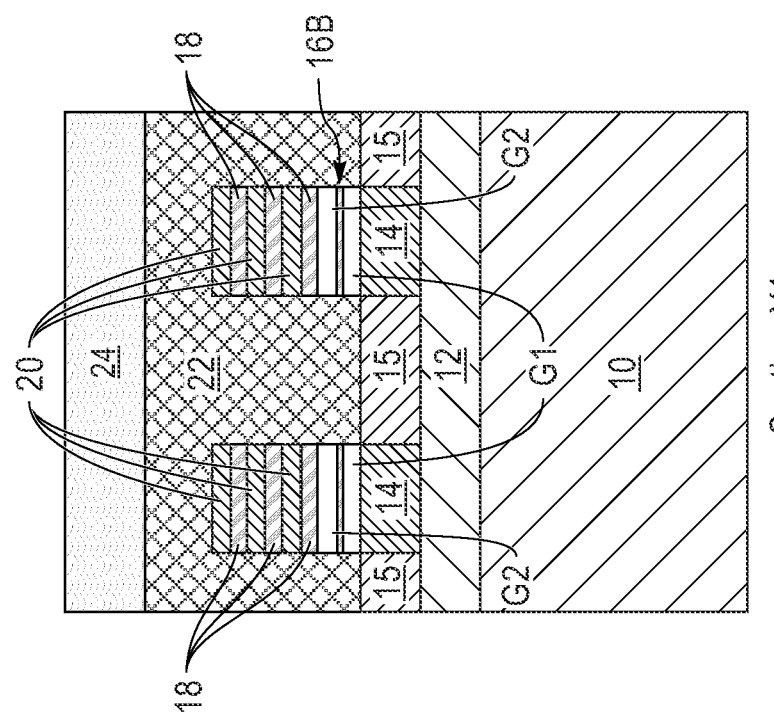

Referring now to FIGS. 3A, 3B and 3C, there are illustrated the exemplary structure shown in FIGS. 2A, 2B and 2C, respectively, after removing the first sacrificial semiconductor material layer 16A to form a first gap G1 and the third sacrificial semiconductor material 16C to form a second gap G2, wherein the first gap G1 and the second gap G2 are spaced apart by the second sacrificial semiconductor material layer 16B. The first sacrificial semiconductor material layer 16A and the third sacrificial semiconductor material layer 16C can be removed utilizing an etching process that is selective in removing the third semiconductor material that provides both the first sacrificial semiconductor material layer 16A and the third sacrificial semiconductor material layer 16C relative to the other semiconductor materials present in the exemplary structure. In one example, and when the third semiconductor material that provides both the first sacrificial semiconductor material layer 16A and the third sacrificial semiconductor material layer 16C is composed of a silicon germanium alloy having a germanium content of 55 atomic percent, vapor phase dry hydrochloric acid (HCl) at a suitable temperature and pressure can be used to remove both the first sacrificial semiconductor material layer 16A and the third sacrificial semiconductor material layer 16C.

Figure 4A:
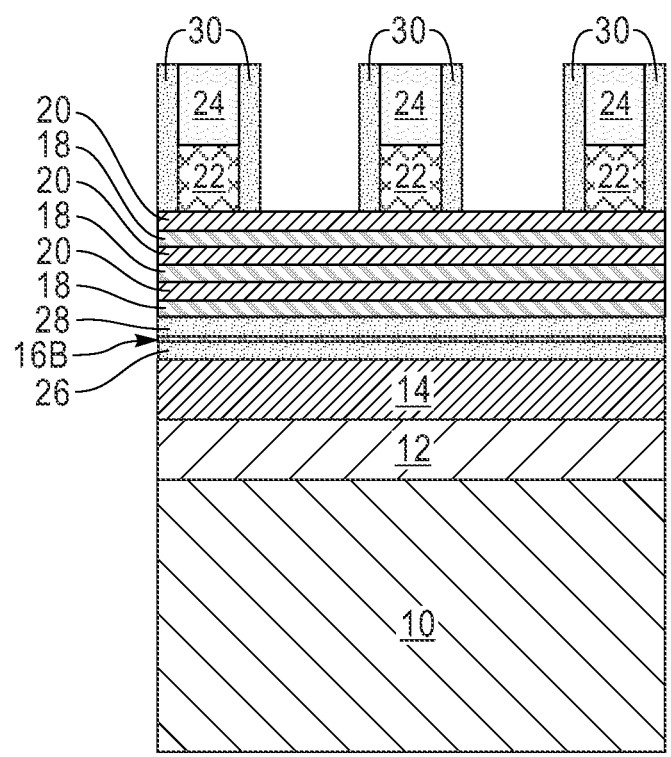
FIGS. 4A, 4B and 4C are cross sectional views of the exemplary structure shown in FIGS. 3A, 3B and 3C, respectively, after forming a gate dielectric spacer material along a sidewall of the at least one sacrificial gate structure, and in the first and second gaps.
Figure 4C:
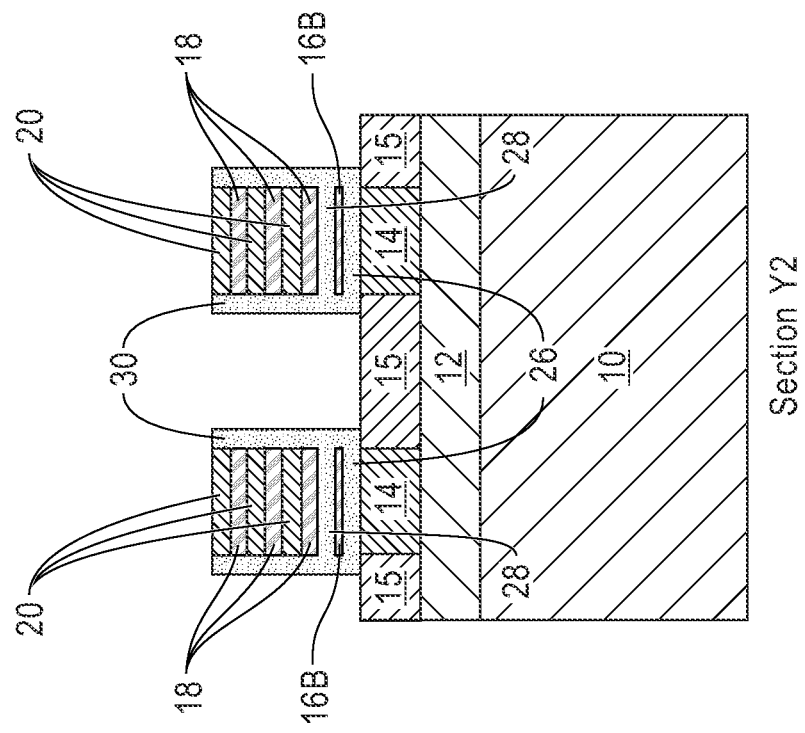
Figure 4B:
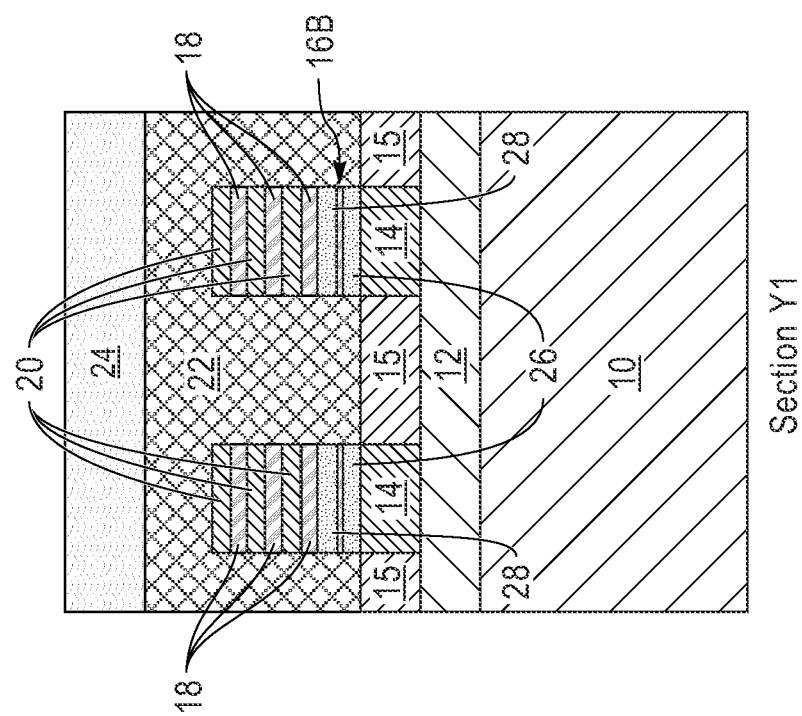

Referring now to FIGS. 4A, 4B and 4C, there are illustrated the exemplary structure shown in FIGS. 3A, 3B and 3C, respectively, after forming a gate dielectric spacer material along a sidewall of the at least one sacrificial gate structure 22 (and along a sidewall of the sacrificial cap 24 if the same is present), and in the first gap G1 and the second gap G2. The gate dielectric spacer material that is formed along the sidewall of the at least one sacrificial gate structure 22 (and along the sidewall of the sacrificial cap 24, if the same is present) can be referred to as a gate spacer 30, the dielectric gate dielectric spacer material that is formed in the first gap G1 can be referred to as a first bottom dielectric isolation layer 26, and the dielectric gate dielectric spacer material that is formed in the second gap G2 can be referred to as a third bottom dielectric isolation layer 28. It is noted that within the present application, the gate spacer 30, the first bottom dielectric isolation layer 26 and the third bottom dielectric isolation layer 28 are of unitary construction (i.e., a single work piece composed of the same gate dielectric spacer material).

The gate dielectric spacer material is composed of a dielectric material having a first dielectric constant which is typically less than 5.5. Examples of gate dielectric spacer materials that can be used in the present application include, but are not limited to, SiN, SiOCN, SiON, SiOC or SiBCN. The gate dielectric spacer material can be formed by a conformal deposition process such as, for example, CVD, PECVD, or ALD, followed by a spacer etch. The conformal deposition and spacer etch provide the gate spacer 30, the first bottom dielectric isolation layer 26 and the third bottom dielectric isolation layer 28 mentioned above.

Figure 5A:
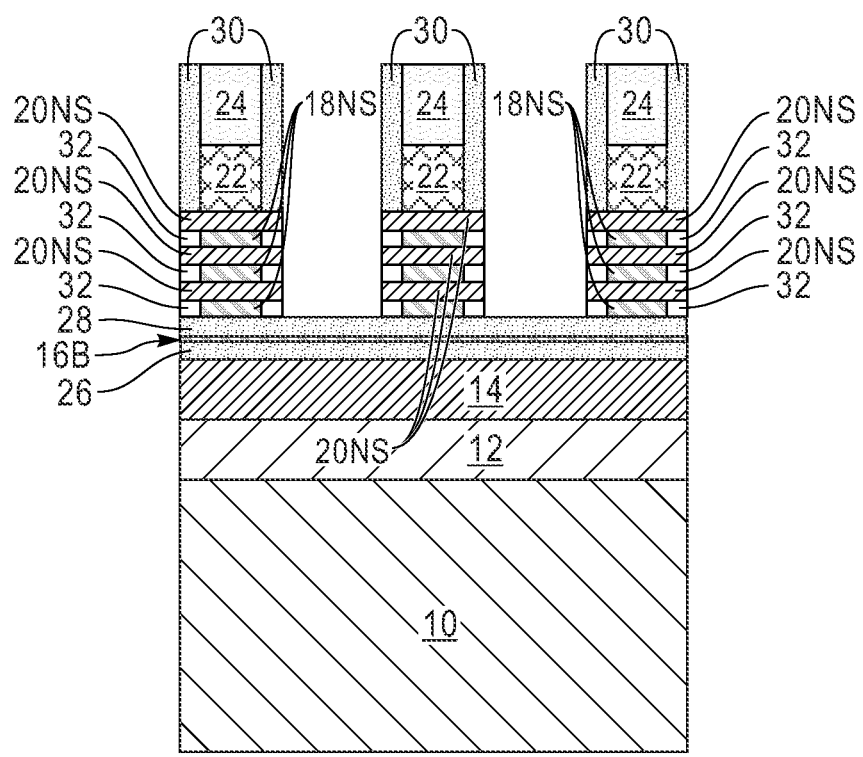
FIGS. 5A, 5B and 5C are cross sectional views of the exemplary structure shown in FIGS. 4A, 4B and 4C, respectively, after patterning the material stack to form a nanosheet stack of alternating fourth sacrificial semiconductor material nanosheets and semiconductor channel material nanosheets, recessing each fourth sacrificial semiconductor material nanosheet of the nanosheet stack, and forming an inner spacer laterally adjacent to each recessed fourth semiconductor material nanosheet.
Figure 5C:
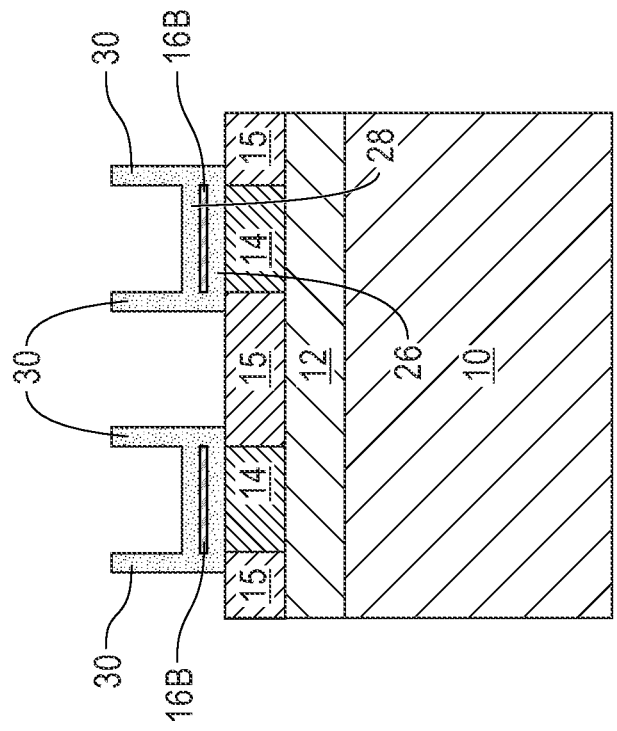
Figure 5B:
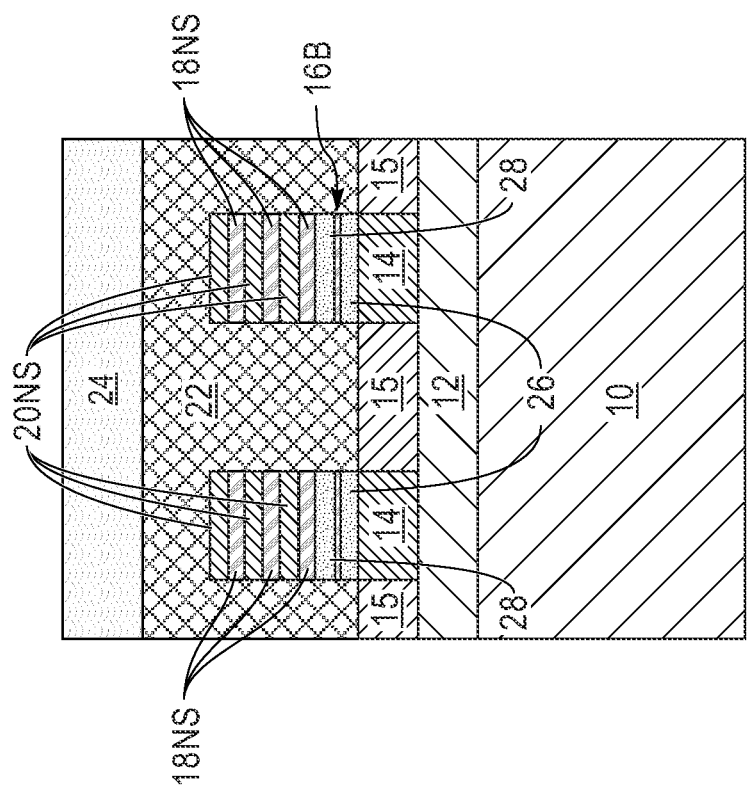

Referring now to FIGS. 5A, 5B and 5C, there are illustrated the exemplary structure shown in FIGS. 4A, 4B and 4C, respectively, after patterning the material stack to form a nanosheet stack of alternating fourth sacrificial semiconductor material nanosheets 18NS and semiconductor channel material nanosheets 20NS, recessing each fourth sacrificial semiconductor material nanosheet 18NS of the nanosheet stack, and forming an inner spacer 32 laterally adjacent to each recessed fourth semiconductor material nanosheet 18NS.

The material stack is patterned utilizing the gate spacer 30, the sacrificial gate structure 22 and, if present, the sacrificial cap 24 as a combed etch mask. The etch converts the material stack into a nanosheet stack as defined above. Note that fourth sacrificial semiconductor material nanosheets 18NS and semiconductor channel material nanosheets 20NS are non-etched portions of the fourth sacrificial semiconductor material layers 18 and semiconductor channel material layers 20. Each fourth sacrificial semiconductor material nanosheet 18NS and each semiconductor channel material nanosheet 20NS have a width from 10 nm to 100 nm, and a length from 20 nm to 150 nm; this length is prior to forming the inner spacers 32. Next, the inner spacers 32 are formed by selectively etching (i.e., recessing) end portions of each fourth sacrificial semiconductor material nanosheet 18NS relative to each semiconductor channel material nanosheet 20NS. This selective etch (which includes a lateral etch) provides inner spacer gaps next to the recessed fourth sacrificial semiconductor material nanosheets 18NS which are then filled with an inner dielectric spacer material such as, for example, SiN, SiBCN, SiOCN, SiON or SiOC. Filling includes conformal deposition of the inner dielectric spacer material followed by performing an isotropic etch back process. The inner spacers 32 are beneath end portions of each semiconductor channel material nanosheet 20NS and the inner spacers 32 have an outermost sidewall that is vertically aligned with an outermost sidewall of the gate spacer 30.

Figure 6A:
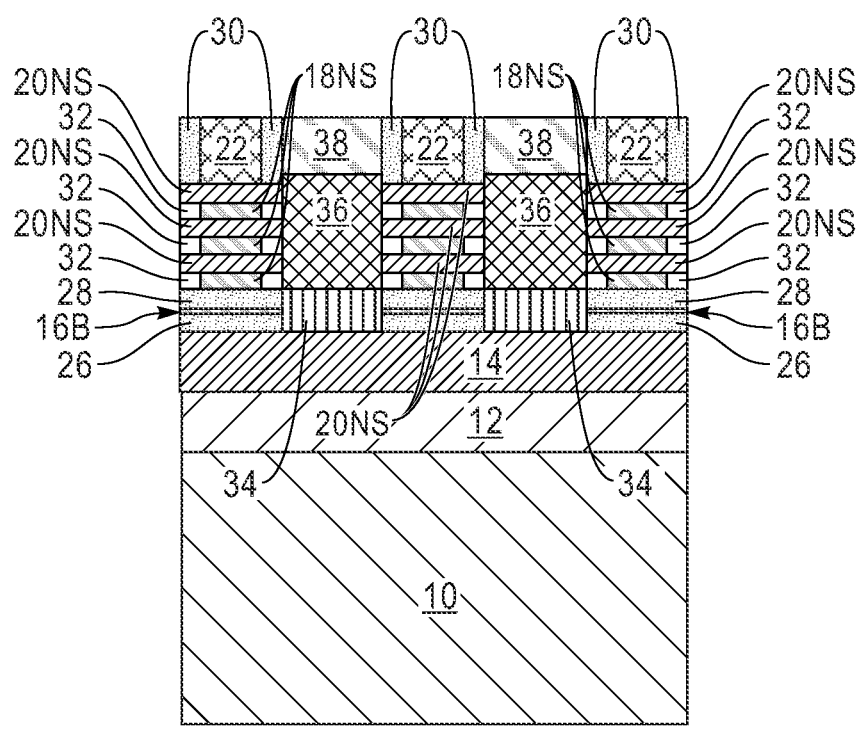
FIGS. 6A, 6B and 6C are cross sectional views of the exemplary structure shown in FIGS. 5A, 5B and 5C, respectively, after performing an etch that physically exposes a surface of a second semiconductor material layer of the semiconductor substrate that is located at a footprint, and on each side, of the at least one sacrificial gate structure, forming a semiconductor buffer layer on the physically exposed surface of the second semiconductor material layer of the semiconductor substrate, forming a source/drain region on the semiconductor buffer layer, and forming a front side interlayer dielectric (ILD) material layer on the source/drain region.
Figure 6C:
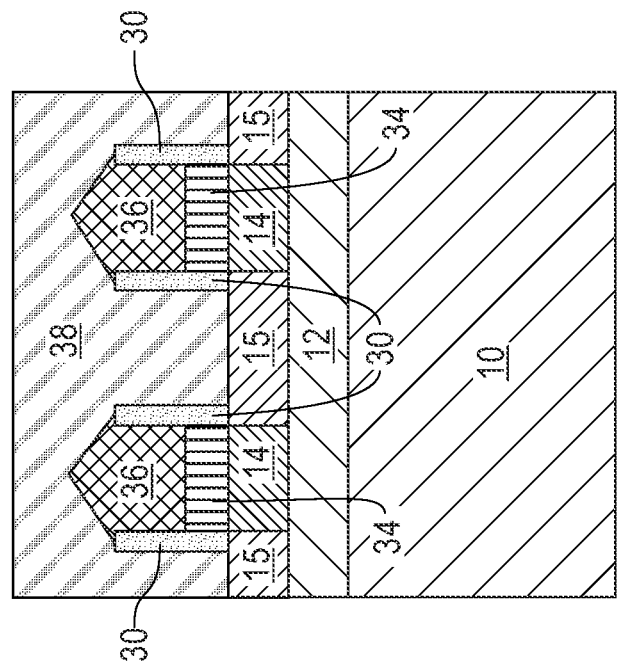
Figure 6B:
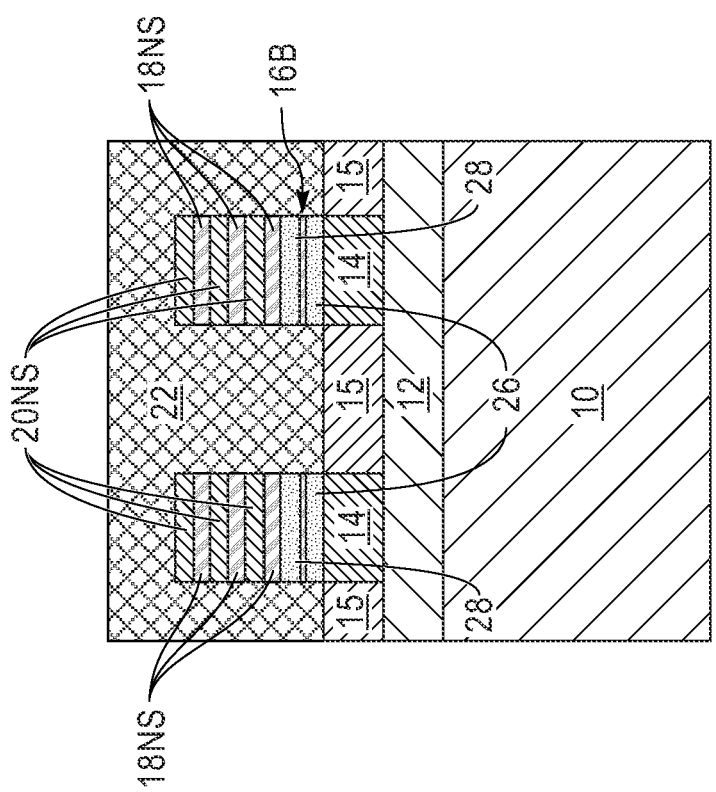

Referring now to FIGS. 6A, 6B and 6C, there are illustrated the exemplary structure shown in FIGS. 5A, 5B and 5C, respectively, after performing an etch that physically exposes a surface of a second semiconductor material layer 14 of the semiconductor substrate that is located at a footprint, and on each side, of the at least one sacrificial gate structure 22, forming a semiconductor buffer layer 34 on the physically exposed surface of the second semiconductor material layer 14 of the semiconductor substrate, forming a source/drain region 36 on the semiconductor buffer layer 34 and extending outward from each of the semiconductor channel material nanosheets 20NS, and forming a front side interlayer dielectric (ILD) material layer 38 on the source/drain region 36.

The etch that physically exposes a surface of the second semiconductor material layer 14 of the semiconductor substrate removes portions of the third bottom dielectric isolation layer 28, the second sacrificial semiconductor material layer 16B, and the first bottom dielectric isolation layer 26 that are not located directly beneath the nanosheet stack and gate spacer 30 that are provided above. This etch can include a dry etching process such as, for example, reactive ion etching (RIE), ion beam etching (IBE) or plasma etching.

The semiconductor buffer layer 34 is formed utilizing an epitaxial growth process, followed by a recess etch. The semiconductor buffer layer 34 includes one of the semiconductor materials mentioned above for the first semiconductor material layer 10; the semiconductor material that provides the semiconductor buffer layer 34 is typically compositionally different from the fourth semiconductor material that provides each of the sacrificial semiconductor material nanosheets 18NS. The semiconductor buffer layer 34 has a topmost surface that is coplanar with, or located above or below, a topmost surface of the third bottom dielectric isolation layer 28 that is present beneath each nanosheet stack. The presence of the semiconductor buffer layer 34 provides a semiconductor growth surface in which a high quality source/drain region 36 can be formed. By "high quality" it is meant that the source/drain region 36 has few epi related defects (such as missing epi, stacking faults, dislocations, etc.).

The source/drain region 36 (which is formed on each side of the nanosheet stack) is composed of a semiconductor material (including one of the semiconductor materials mentioned above for the first semiconductor material layer 10) and a dopant. As used herein, a "source/drain or S/D" region can be a source region or a drain region depending on subsequent wiring and application of voltages during operation of the transistor. The semiconductor material that provides the source/drain region 36 can be compositionally the same as, or compositionally different from, the semiconductor material that provides each semiconductor channel material nanosheet 20NS and/or the first semiconductor material layer 10. The dopant that is present in the source/drain region 36 can be either a p-type dopant or an n-type dopant. The term "p-type" refers to the addition of impurities to an intrinsic semiconductor that creates deficiencies of valence electrons. In a silicon-containing semiconductor material, examples of p-type dopants, i.e., impurities, include, but are not limited to, boron, aluminum, gallium, phosphorus and indium. "N-type" refers to the addition of impurities that contributes free electrons to an intrinsic semiconductor. In a silicon containing semiconductor material, examples of n-type dopants, i.e., impurities, include, but are not limited to, antimony, arsenic and phosphorous. In one example, the source/drain region 36 can have a dopant concentration of from $4\times10^{20}$ atoms/cm$^3$ to $3\times10^{21}$ atoms/cm$^3$. The source/drain region 36 can be formed by epitaxial growth, followed by a recessed etch to reduce the height of the source/drain region 36 to be less than a height of the sacrificial gate structure 22.

The front side ILD material layer 38 can be composed of a dielectric material including, for example, silicon oxide, silicon nitride, undoped silicate glass (USG), fluorosilicate glass (FSG), borophosphosilicate glass (BPSG), a spin-on low-k dielectric layer, a chemical vapor deposition (CVD) low-k dielectric layer or any combination thereof. The term "low-k" denotes a dielectric material that has a dielectric constant of less than 4.0. All dielectric constants mentioned herein are measured in a vacuum unless otherwise indicated. The front side ILD material layer 38 can be formed by deposition of the dielectric material, followed by a planarization process such as, for example, chemical mechanical polishing (CMP). The deposition of the dielectric material can include, for example, CVD, PECVD, ALD, or spin-on coating. The planarization process can remove the sacrificial cap 24 as well as an upper portion of each gate spacer 30. The front side ILD material layer 38 has a topmost surface that is coplanar with a topmost surface of at least the sacrificial gate structure 22.

Figure 7A:
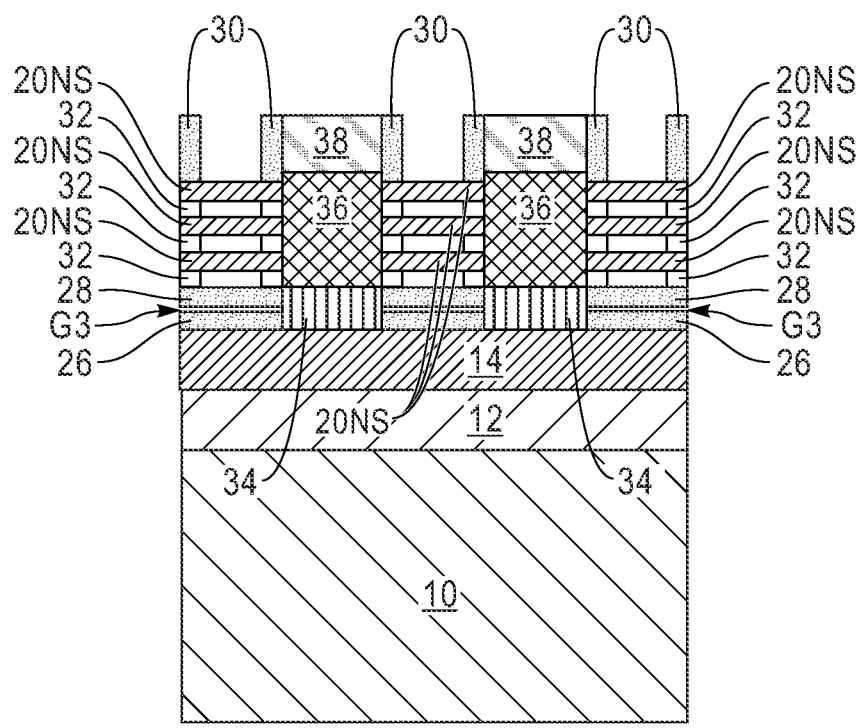
FIGS. 7A, 7B and 7C are cross sectional views of the exemplary structure shown in FIGS. 6A, 6B and 6C, respectively, after removing the at least one sacrificial gate structure, the second sacrificial semiconductor material layer and each recessed fourth semiconductor material nanosheet, wherein the removal of the second semiconductor material layer forms a third gap between the gate dielectric spacer material filled first and second gaps.
Figure 7C:
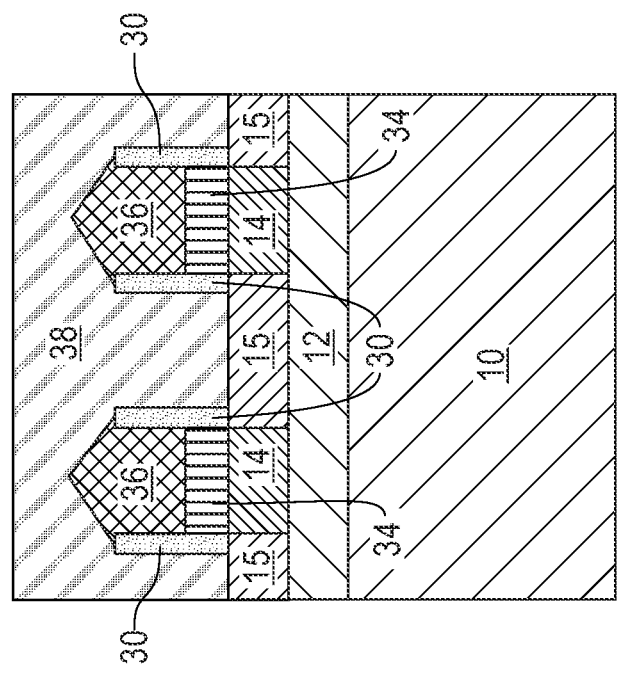
Figure 7B:
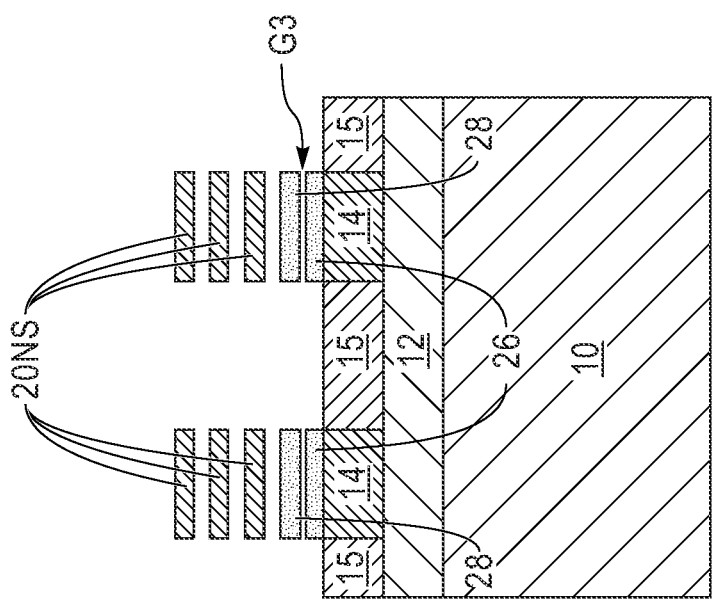

Referring now to FIGS. 7A, 7B and 7C, there are illustrated the exemplary structure shown in FIGS. 6A, 6B and 6C, respectively, after removing the at least one sacrificial gate structure 22, the second sacrificial semiconductor material layer 16B and each recessed fourth semiconductor material nanosheet 18NS, wherein the removal of the second semiconductor material layer 16B forms a third gap G3 between the gate dielectric spacer material filled first and second gaps; i.e., between the first bottom dielectric isolation layer 26 and the third bottom dielectric isolation layer 28.

The removal of the sacrificial gate structure 22 includes an etching process that is selective in removing the material that provides the sacrificial gate structure 22. Typically, a single etch is used, but multiple etching can be used depending on the materials that are present in the sacrificial gate structure 22. The removal of the sacrificial gate structures 22 includes removing the sacrificial gate material and, if present, the sacrificial gate dielectric material. The removal of the sacrificial gate structures 22 reveals each the nanosheet stack.

The second sacrificial semiconductor material layer 16B and each recessed fourth semiconductor material nanosheet 18NS can be removed utilizing a same selective etching process. As well as creating the third gap G3, this selective etch suspended portions of each semiconductor channel material nanosheet 20NS.

Figure 8A:
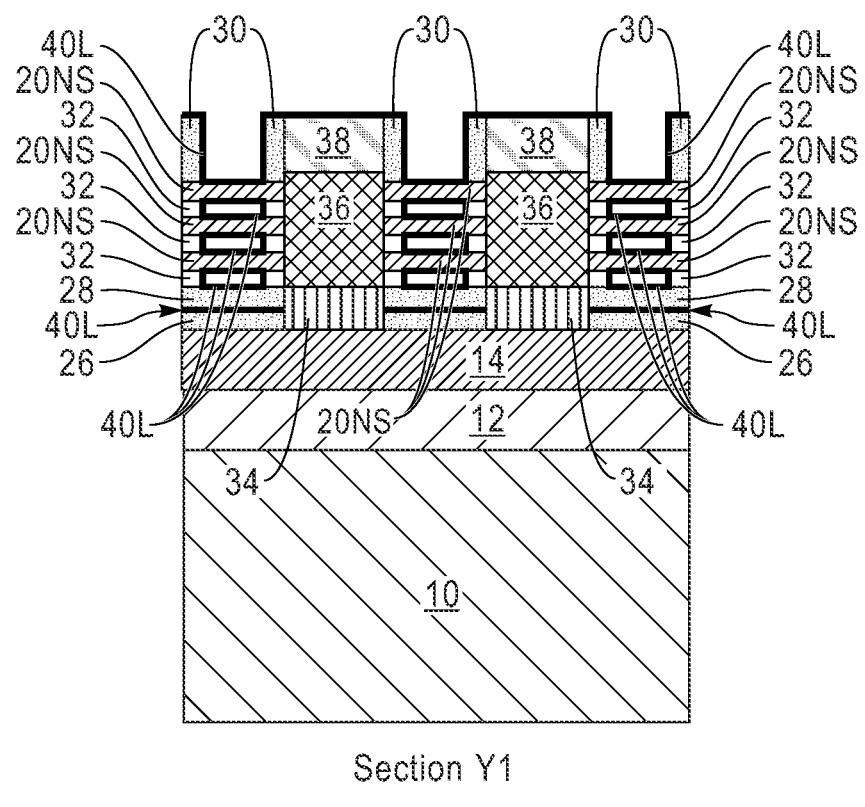
FIGS. 8A, 8B and 8C are cross sectional views of the exemplary structure shown in FIGS. 7A, 7B and 7C, respectively, after forming a high-k gate dielectric material in the third gap and on physically exposed portions of each semiconductor channel material nanosheet.
Figure 8C:
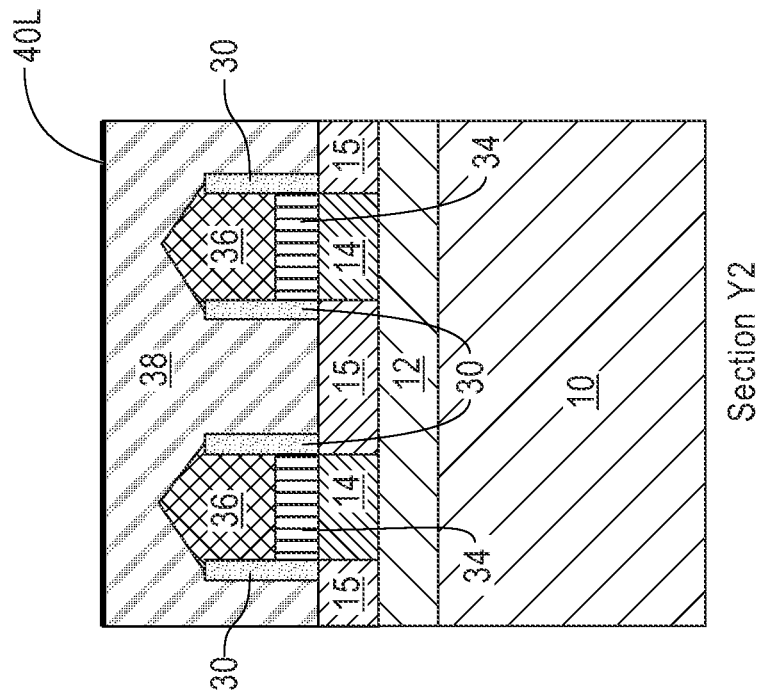
Figure 8B:
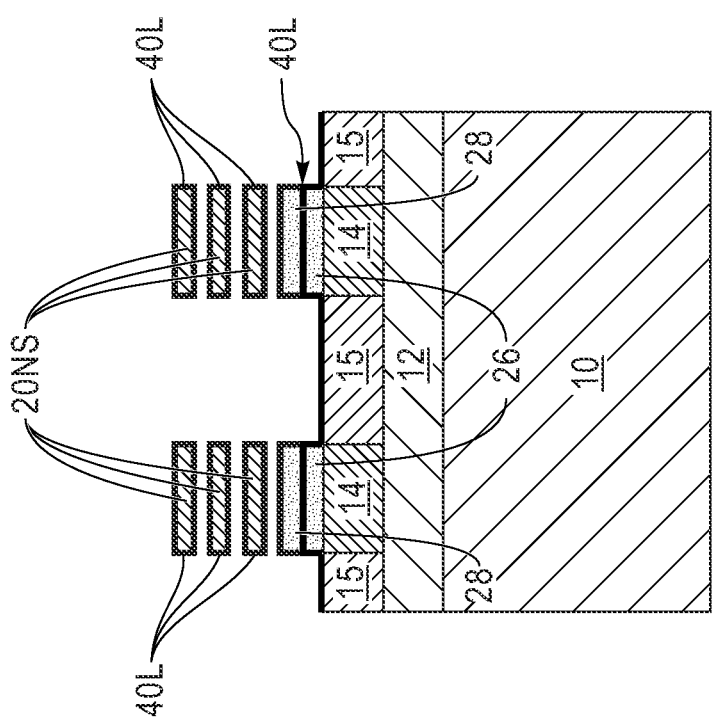

Referring now to FIGS. 8A, 8B and 8C, there are illustrated the exemplary structure shown in FIGS. 7A, 7B and 7C, respectively, after forming a high-k gate dielectric material 40L in the third gap and on physically exposed portions of each semiconductor channel material nanosheet 20Ns (the high-k gate dielectric material 40L is also formed on physically exposed surfaces of the shallow trench isolation structure 15 as is shown in FIG. 8B as well as on a topmost surface of the front side ILD material layer as is shown in FIGS. 8A and 8C). The high-k gate dielectric material 40L has a second dielectric constant that is greater than the first dielectric constant mentioned above for the gate dielectric spacer material. The high-k gate dielectric material 40L thus comprises a dielectric material that is compositionally different from the gate dielectric spacer material.

The high-k gate dielectric material 40L has a dielectric constant of 4.0 or greater. illustrative examples of high-k gate dielectric materials include metal oxides such as, for example, silicon dioxide, hafnium dioxide (HfO$_2$), hafnium silicon oxide (HfSiO), hafnium silicon oxynitride (HfSiO), lanthanum oxide (La$_2$O$_3$), lanthanum aluminum oxide (LaAlO$_3$), zirconium dioxide (ZrO$_2$), zirconium silicon oxide (ZrSiO$_4$), zirconium silicon oxynitride (ZrSiO$_x$N$_y$), tantalum oxide (TaO$_x$), titanium oxide (TiO), barium strontium titanium oxide (BaO$_6$SrTi$_2$), barium titanium oxide (BaTiO$_3$), strontium titanium oxide (SrTiO$_3$), yttrium oxide (Yb$_2$O$_3$), aluminum oxide (Al$_2$O$_3$), lead scandium tantalum oxide (Pb(Sc,Ta)O$_3$), and/or lead zinc niobite (Pb(Zn,Nb)O). The high-k gate dielectric material 40L can further include dopants such as lanthanum (La), aluminum (Al) and/or magnesium (Mg). The high-k gate dielectric material 40L can be formed utilizing any conformal deposition process such as, for example, CVD, PECVD or ALD.

Figure 9A:
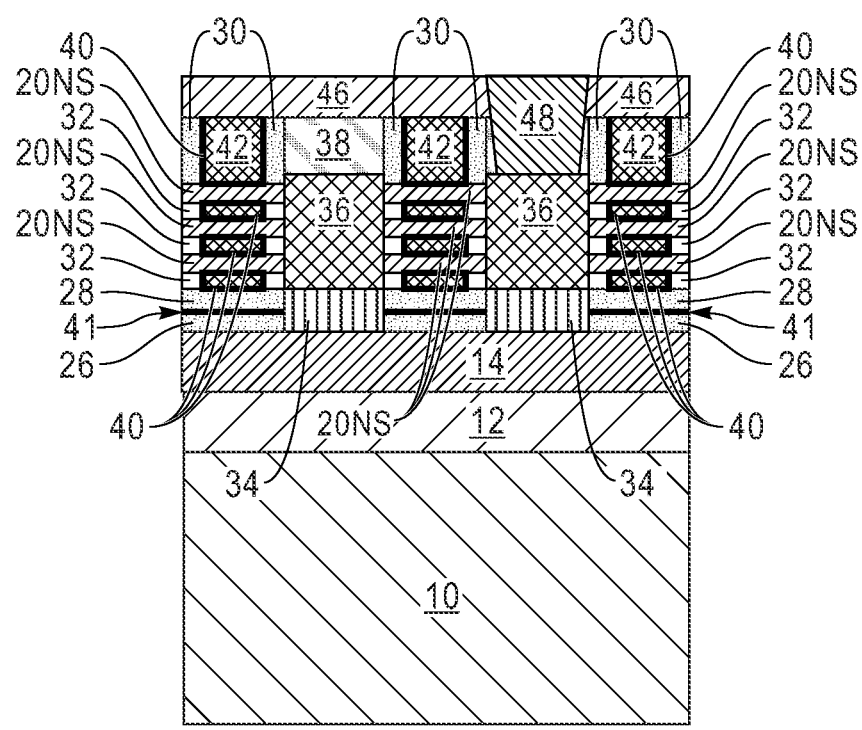
FIGS. 9A, 9B and 9C are cross sectional views of the exemplary structure shown in FIGS. 8A, 8B and 8C, respectively, after forming a gate electrode, forming a gate cut dielectric pillar, forming a second front side ILD material layer, and forming front side contact structures.
Figure 9C:
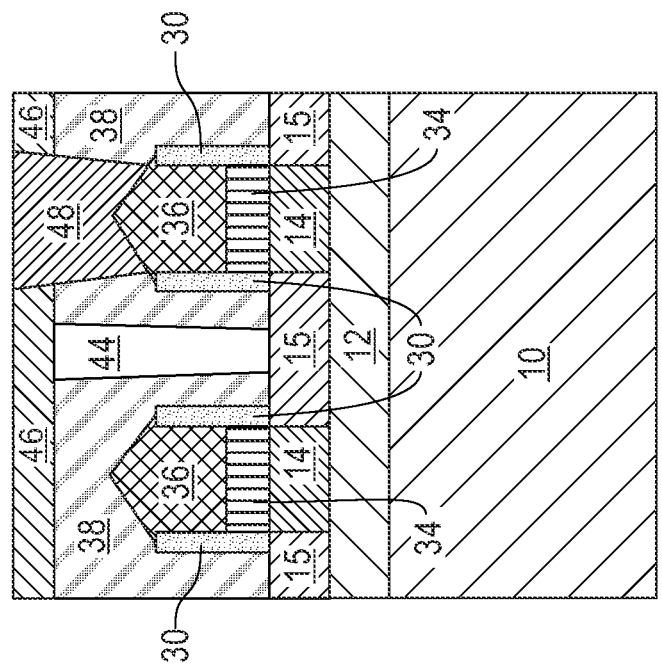
Figure 9B:
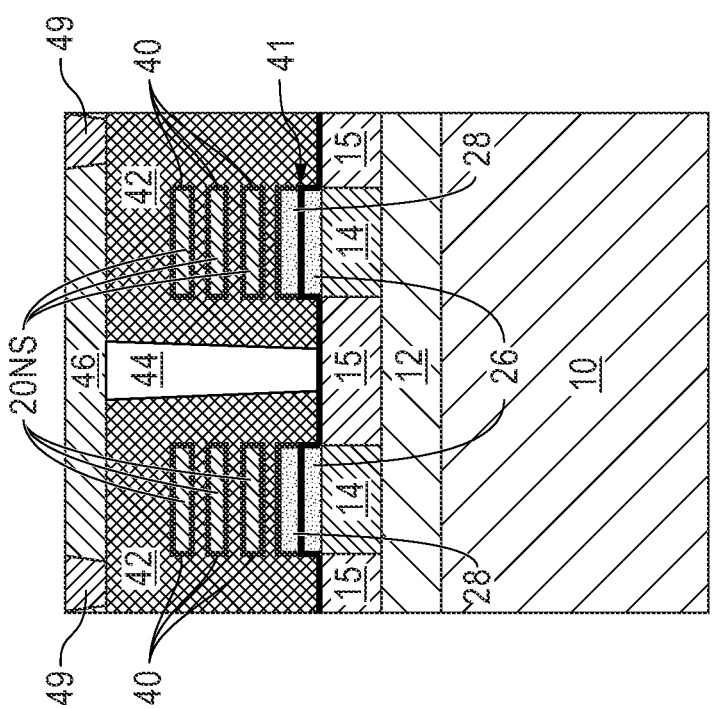

Referring now to FIGS. 9A, 9B and 9C, there are illustrated the exemplary structure shown in FIGS. 8A, 8B and 8C, respectively, after forming a gate electrode 42, forming a gate cut dielectric pillar 44, forming a second front side ILD material layer 46, and forming front side contact structures 48, 49. The gate electrode 42 comprises a work function metal (WFM) layer and optionally a conductive metal layer.

The WFM layer can be used to set a threshold voltage of the transistor to a desired value. In some embodiments, the WFM layer can be selected to effectuate an n-type threshold voltage shift. "N-type threshold voltage shift" as used herein means a shift in the effective work-function of the work-function metal-containing material towards a conduction band of silicon in a silicon-containing material. In one embodiment, the work function of the n-type work function metal ranges from 4.1 eV to 4.3 eV. Examples of such materials that can effectuate an n-type threshold voltage shift include, but are not limited to, titanium aluminum, titanium aluminum carbide, tantalum nitride, titanium nitride, hafnium nitride, hafnium silicon, or combinations and thereof. In other embodiments, the WFM layer can be selected to effectuate a p-type threshold voltage shift. In one embodiment, the work function of the p-type work function metal ranges from 4.9 eV to 5.2 eV. As used herein, "threshold voltage" is the lowest attainable gate voltage that will turn on a semiconductor device, e.g., transistor, by making the channel of the device conductive. The term "p-type threshold voltage shift" as used herein means a shift in the effective work-function of the work-function metal-containing material towards a valence band of silicon in the silicon containing material. Examples of such materials that can effectuate a p-type threshold voltage shift include, but are not limited to, titanium nitride, and tantalum carbide, hafnium carbide, and combinations thereof. The optional conductive metal layer of gate electrode 42 can be composed of aluminum (Al), tungsten (W), copper (Co), etc.

The gate electrode 42 can be formed by a deposition process followed by a planarization process such as, for example, CMP. The deposition process includes, but is not limited to, CVD, PECVD, sputtering or plating. The planarization process removes any WFM layer and, if present, the conductive metal layer that is present on top of the first ILD material layer 38 and the gate spacer 30. This planarization process also removes the high-k gate dielectric material 40L that is present on top of the first ILD material layer 38 and the gate spacer 30. High-k gate dielectric material 40L remains in the third gap G3, along the physically exposed surfaces of each semiconductor channel material nanosheet, along an inner sidewall of the gate spacer, along the topmost surface of the shallow trench isolation structure 15, and along physically exposed surfaces of the first bottom dielectric isolation layer 26 and the third bottom dielectric isolation layer 38. The remaining high-k gate dielectric material 40L that is present in the third gap G3 can be referred to herein as a second bottom dielectric isolation layer 41 of a tri-layered bottom dielectric isolation structure that also includes the first bottom dielectric isolation layer 26 and the third bottom dielectric isolation layer 28. The second bottom dielectric isolation 41 of the tri-layered bottom dielectric isolation structure is sandwiched between the first bottom dielectric isolation layer and the third bottom dielectric isolation layer 28 of the tri-layered bottom dielectric isolation structure. The high-k gate dielectric material 40L that is present on the physically exposed portions of the semiconductor channel material nanosheets 20NS, along the inner sidewall of the gate spacer 30 form a gate dielectric material layer 40 of a gate structure of a transistor; the gate structure further includes the gate electrode 42 that comprises the WFM layer and the optional conductive metal layer. The high-k material layer that remains on the physically exposed surfaces of the first and second bottom dielectric isolation layers 26 and 28 also forms a gate dielectric material layer of the gate structure.

After forming the gate electrode 42, the gate cut dielectric pillar 44 is formed by forming a gate cut trench (not shown) in the gate electrode 42 and thereafter filling the gate cut trench with a gate cut dielectric material such as, for example, silicon dioxide or silicon nitride. The gate cut dielectric pillar 44 extends through the gate electrode 42 and a portion of the high-k gate material that is present on the shallow trench isolation structure 15. The gate cut dielectric pillar 44 has a topmost surface that is coplanar with a topmost surface of the gate electrode 42. In some embodiments, the gate cut dielectric pillar 44 can be omitted.

The second front side ILD material layer 46 includes one of the dielectric materials mentioned above for the first front side ILD material layer 38. The dielectric material that provides the second front side ILD material layer 46 can be compositionally the same as, or compositionally different from, the dielectric material that provides the first front side ILD material layer 38. The second front side ILD material layer 46 can be formed utilizing one of the deposition processes mentioned above for forming the dielectric material that provides the first front side ILD material layer 38.

Front side contact structures 48, 49 are formed utilizing any conventional metallization process. The front side contact structure that contacts the source/drain region 36 can be referred to as a front side source/drain contact structure 48, while the front side contact structure that contact the gate electrode 42 can be referred to as a front side gate contact structure 49. The front side contact structures 48, 49 include at least a contact conductor material such as, for example, W, Cu, Al, Co, Ru, Mo, Os, Ir, Rh or an alloy thereof. In embodiments, the front side contact structures 48, 49 can also include a silicide liner such as TiSi, NiSi, NiPtSi, etc., and an adhesion metal liner, such as TiN. Each front side contact structure 48, 49 can be formed by forming a contact opening in various front side ILD material layers by lithography and etching. In case of the front side gate contact structure 49 the contact opening is formed only through the second front side ILD material layer 46, while in the case of the front side source/drain contact structure 48 the contact opening is formed through both the first and second front side ILD material layers 38, 46. The contact conductor material can be formed in the contact openings by any suitable deposition method such as, for example, ALD, CVD, PVD or plating. In some embodiments (not shown), a metal semiconductor alloy region can be formed in each of the contact openings prior to forming the contact conductor material. The metal semiconductor alloy region can be composed of a silicide or germicide. In one or more embodiments of the present application, the metal semiconductor alloy region can be formed by first depositing a metal layer (not shown) in the trenches. The metal layer can include a metal such as Ni, Co, Pt, W, Ti, Ta, a rare earth metal (e.g., Er, Yt, La), an alloy thereof, or any combination thereof. The metal layer can be deposited by ALD, CVD, PVD or ALD. The thickness of the metal layer can be from 2 nm to 10 nm, although lesser and greater thicknesses can also be employed. A diffusion barrier (not shown) such as, for example, TiN or TaN, can then be formed over the metal layer. An anneal process can be subsequently performed at an elevated temperature to induce reaction of the semiconductor material of the source/drain regions to provide the metal semiconductor alloy region. The unreacted portion of the metal layer, and, if present, the diffusion barrier, are then removed, for example, by an etch process (or a plurality of etching processes). In one embodiment, the etching process can be a wet etch that removes the metal in the metal layer selective to the metal semiconductor alloy in the metal semiconductor alloy regions. Each front side contact structure 48, 49 can further include one or more contact liners (not shown). In one or more embodiments, the contact liner (not shown) can include a diffusion barrier material. Exemplary diffusion barrier materials include, but are not limited to, Ti, Ta, Ni, Co, Pt, W, Ru, TiN, TaN, WN, WC, an alloy thereof, or a stack thereof such as Ti/TiN and Ti/WC. The contact liner can be formed utilizing a conformal deposition process including CVD or ALD. The contact liner that is formed can have a thickness ranging from 1 nm to 5 nm, although lesser and greater thicknesses can also be employed. Each front side contact structure 48, 49 has a topmost surface that is coplanar with a topmost surface of the second front side ILD material layer 46.

Figure 10A:
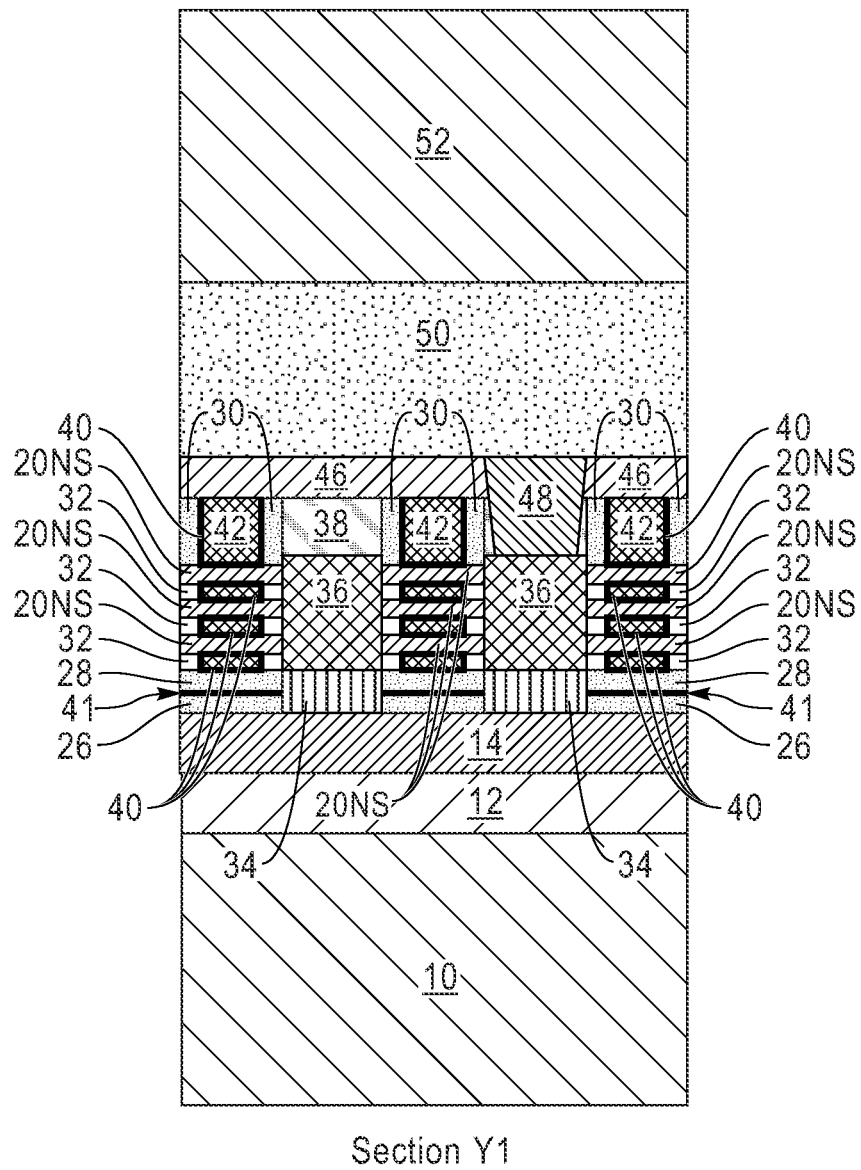

Referring now to FIGS. 10A, 10B and 10C, there are illustrated the exemplary structure shown in FIGS. 9A, 9B and 9C, respectively, after forming a front side back-end-of-the-line (BEOL) structure 50 and a carrier wafer 52. The front side BEOL structure 50 includes one or more interconnect dielectric material layers that contain one or more wiring regions embedded therein. The front side BEOL structure 50 can be formed utilizing BEOL processing techniques that are well known to those skilled in the art. As is shown in FIGS. 10A-10C, the front side BEOL structure 50 is electrically connected to one of the source/drain regions 36 by the front side source/drain contact structure 48, and it is also electrically connected to the gate electrode 42 by the front side gate contact structure 39. The carrier wafer 52 can include one of the semiconductor materials mentioned above for the first semiconductor material layer 10. In the present application, the carrier wafer 52 is bonded to the front side BEOL structure 50.

Figure 11A:
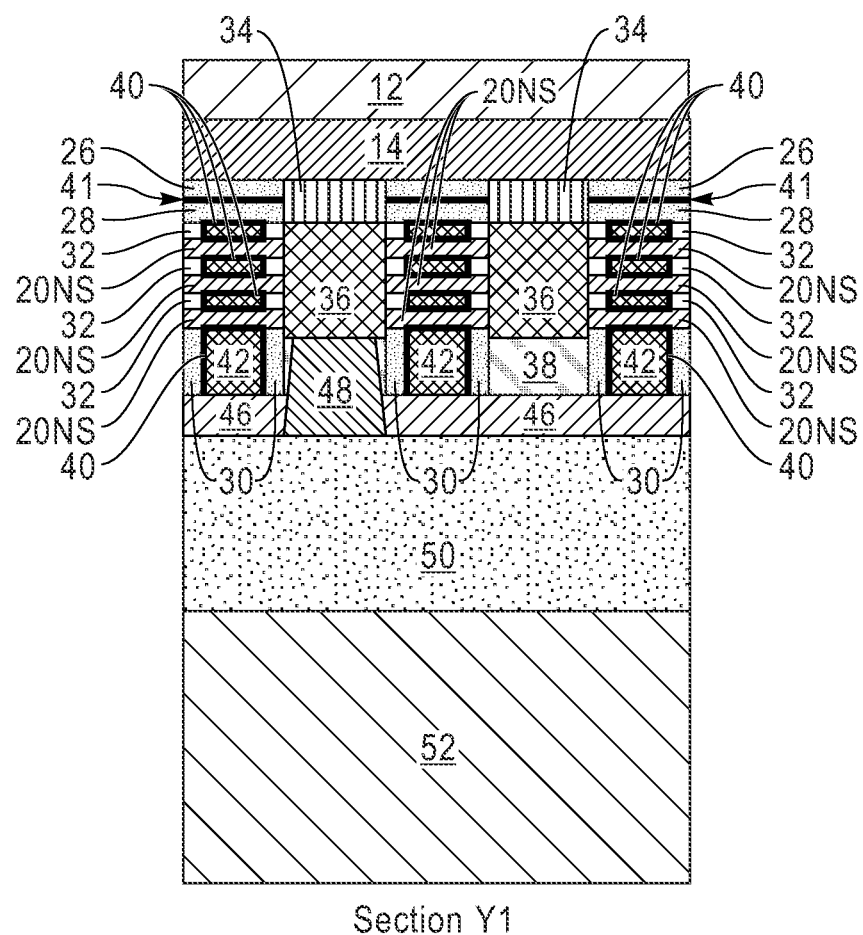
FIGS. 11A, 11B and 11C are cross sectional views of the exemplary structure shown in FIGS. 10A, 10B and 10C, respectively, after wafer flipping to physically expose a backside of the semiconductor substrate, and removing a first semiconductor material layer of the semiconductor substrate to physically expose an etch stop layer of the semiconductor substrate.
Figure 11C:
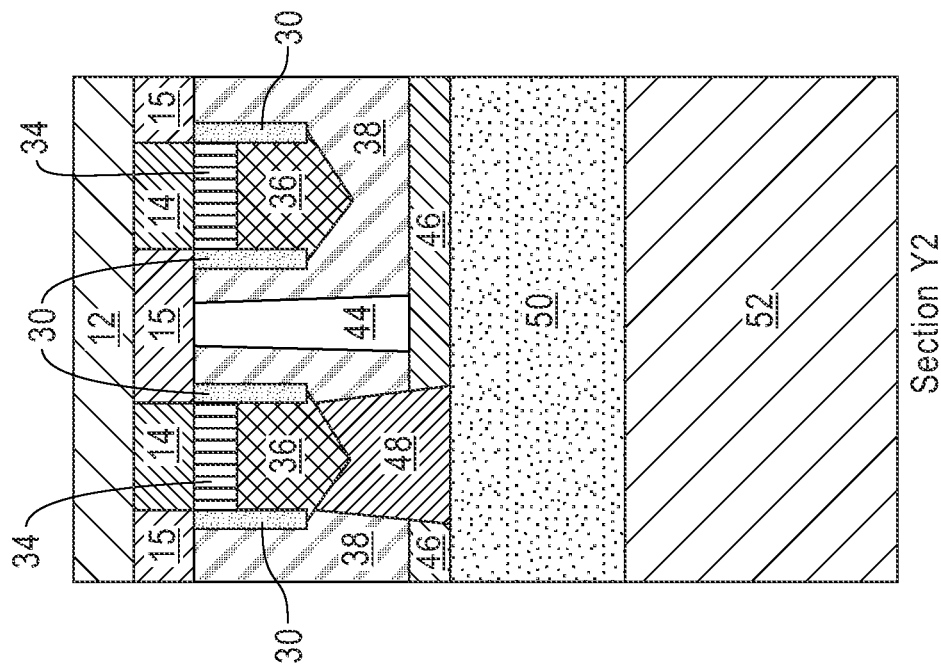
Figure 11B:
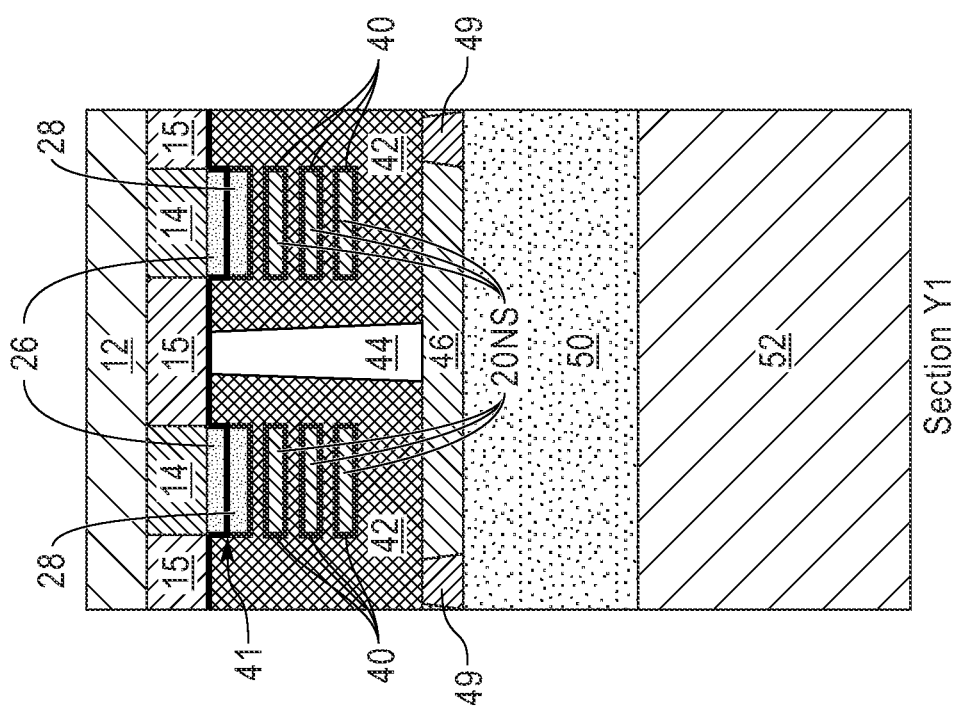

Referring now to FIGS. 11A, 11B and 11C, there are illustrated the exemplary structure shown in FIGS. 10A, 10B and 10C, respectively, after wafer flipping to physically expose a backside of the semiconductor substrate 10/12/14, and removing the first semiconductor material layer 10 of the semiconductor substrate to physically expose the etch stop layer 12 of the semiconductor substrate. The flipping will allow back side processing of the exemplary structure. In the present application, the structure is flipped 180°. Flipping of the structure can be performed by hand or by utilizing a mechanical means such as, for example, a robot arm. The removal of the first semiconductor material layer 10 can be performed utilizing a material removal process that is selective in removing the semiconductor material that provides the first semiconductor material layer 10.

Figure 12A:
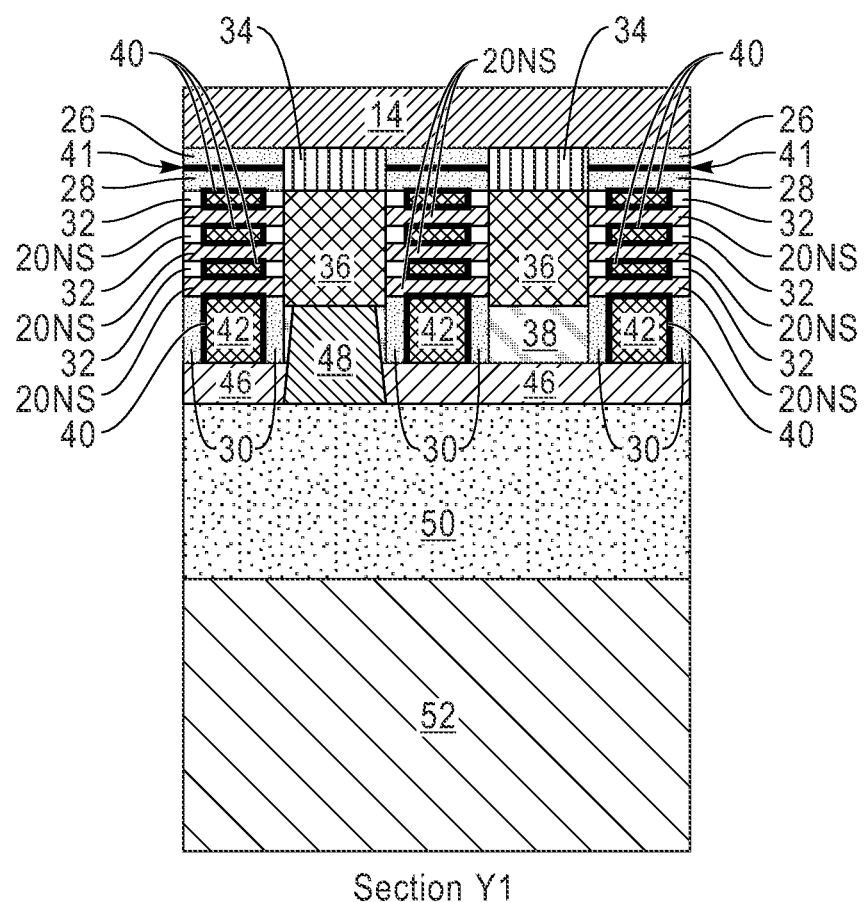
FIGS. 12A, 12B and 12C are cross sectional views of the exemplary structure shown in FIGS. 11A, 11B and 11C, respectively, after removing the physically exposed etch stop layer of the semiconductor substrate to physically expose a second semiconductor material layer of the semiconductor substrate.
Figure 12C:
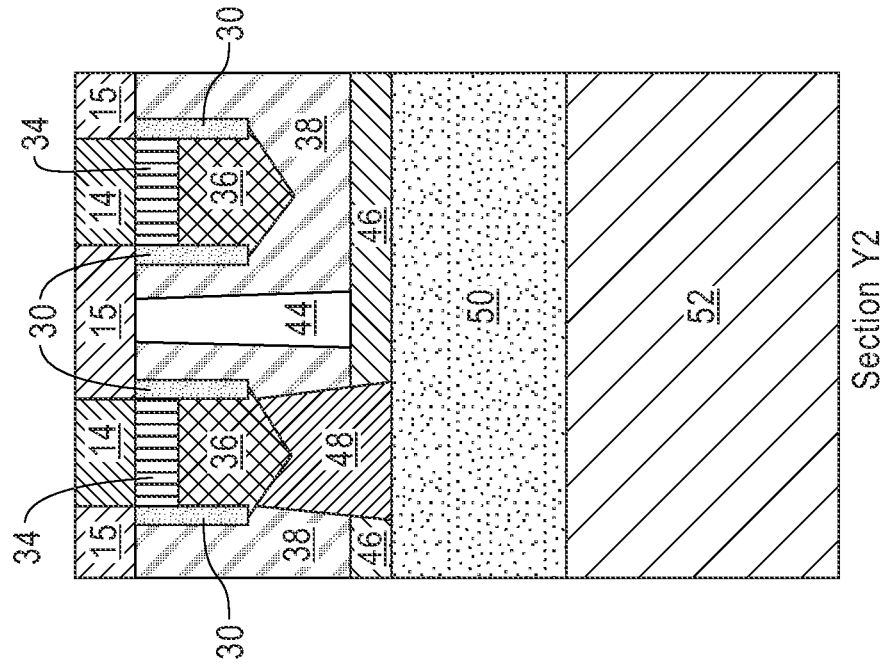
Figure 12B:
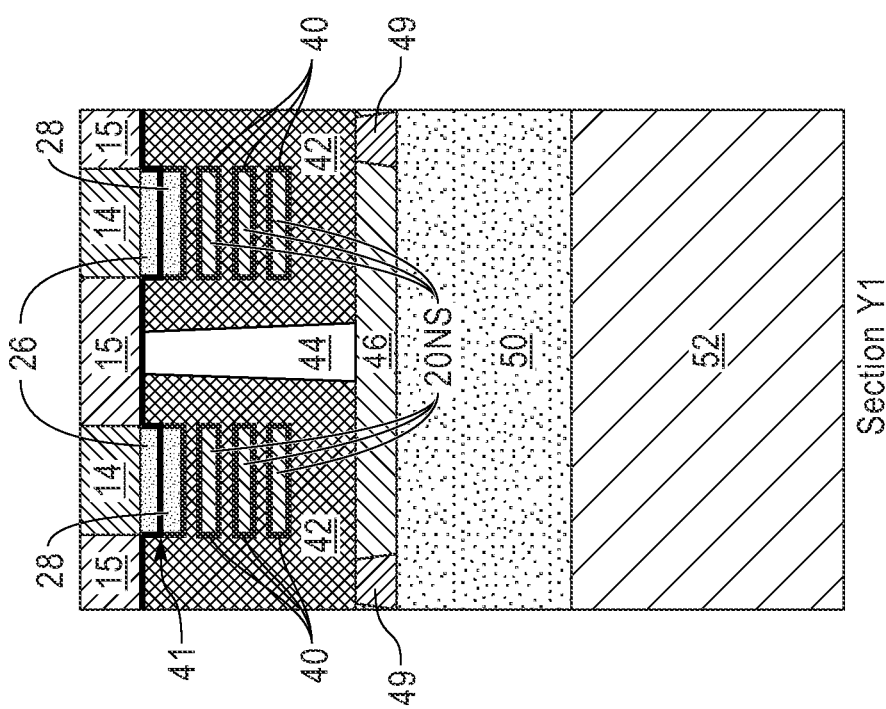

Referring now to FIGS. 12A, 12B and 12C, there are illustrated the exemplary structure shown in FIGS. 11A, 11B and 11C, respectively, after removing the physically exposed etch stop layer 12 of the semiconductor substrate to physically expose the second semiconductor material layer 14 of the semiconductor substrate. The removal of the etch stop layer 12 includes a material removal process that is selective in removing the etch stop layer 12.

Figure 13A:
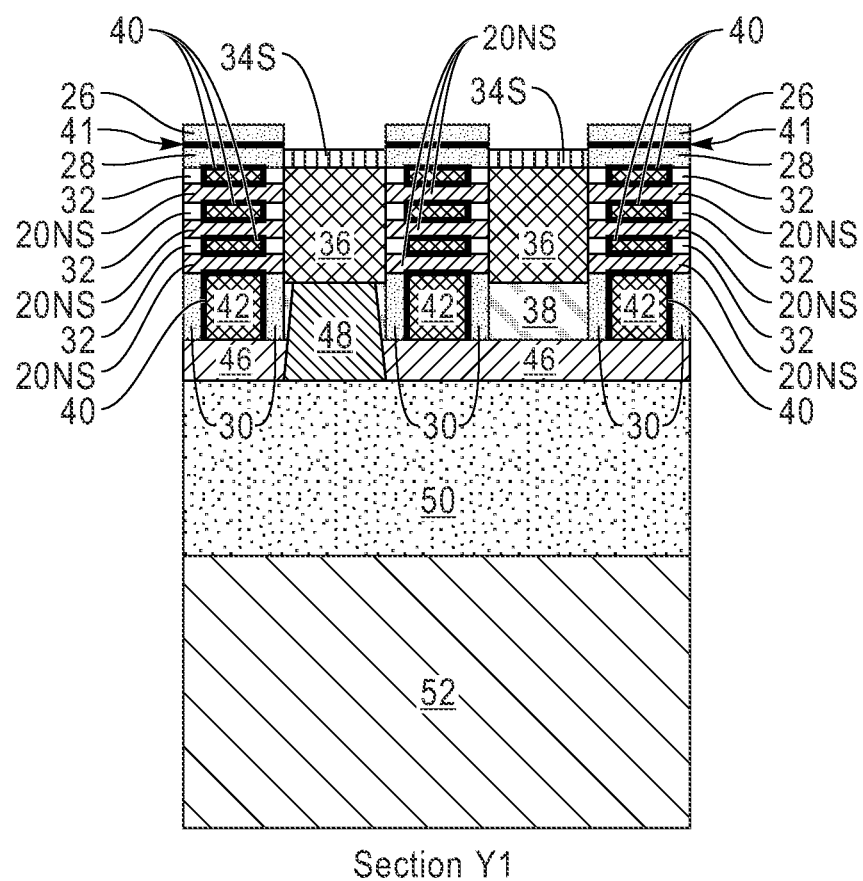

Referring now to FIGS. 13A, 13B and 13C, there are illustrated the exemplary structure shown in FIGS. 12A, 12B and 12C, respectively, after removing the second semiconductor material layer 14 and a portion of the semiconductor buffer layer 34. The removal of the second semiconductor material layer 14 includes a material removal process that is selective in removing the second semiconductor material layer 14. The removal of a portion of the semiconductor buffer layer 34 includes a recess etch that is selective in removing the semiconductor buffer layer. The recess etch used to remove a portion of the semiconductor buffer layer 34 can be a same etch or a different etch than the selective etch that is used in removing the second semiconductor material layer 14. A portion of the semiconductor buffer layer 34 remains between the tri-layered bottom dielectric isolation structure 26/41/28 as shown in FIG. 13A and between the gate spacer 30 shown in FIG. 13C. The semiconductor buffer layer 34 that remains can be referred to herein as a recessed semiconductor buffer layer 34S.

Figure 14A:
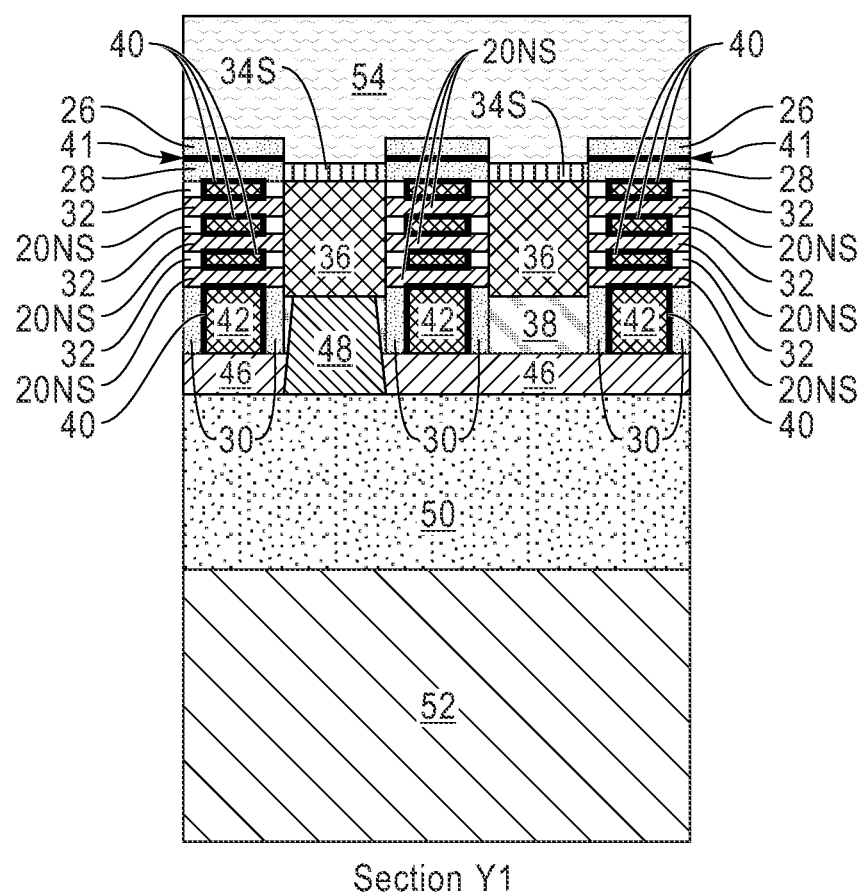
FIGS. 14A, 14B and 14C are cross sectional views of the exemplary structure shown in FIGS. 13A, 13B and 13C, respectively, after forming a backside ILD material layer.
Figure 14C:
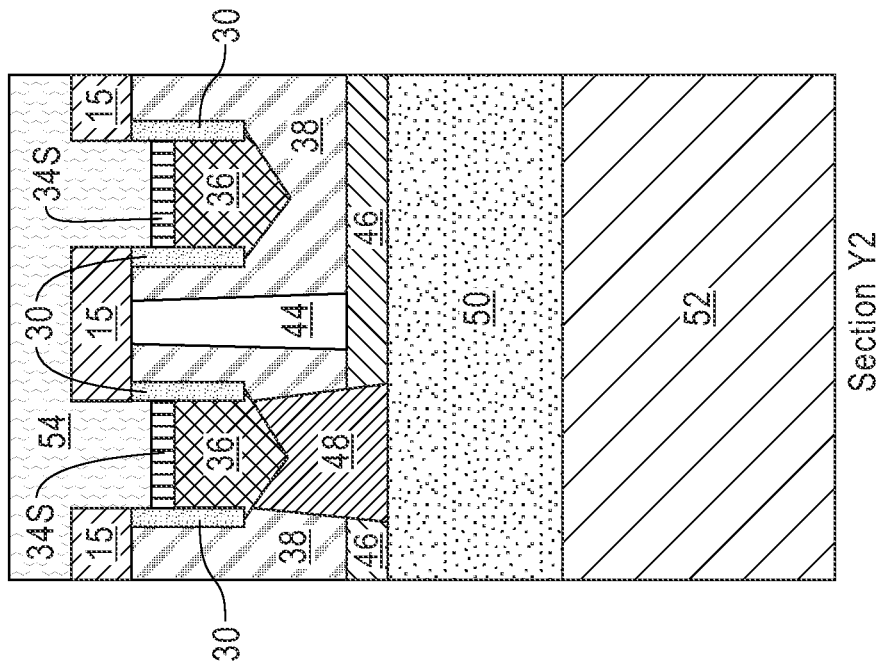
Figure 14B:
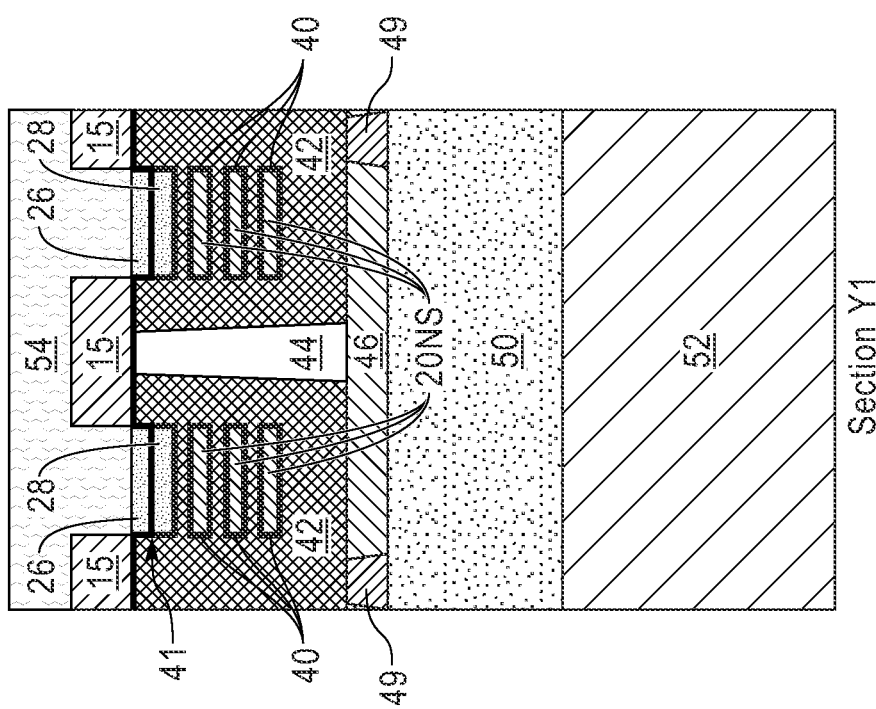

Referring now to FIGS. 14A, 14B and 14C, there are illustrated the exemplary structure shown in FIGS. 13A, 13B and 13C, respectively, after forming a backside ILD material layer 54. The backside ILD material layer 54 includes one of the dielectric materials mentioned above for the first front side ILD material layer 38. The dielectric material that provides the backside ILD material layer 54 can be compositionally the same as, or compositionally different from, the dielectric material that provides the first front side ILD material layer 38. The backside ILD material layer 54 can be formed utilizing one of the deposition processes mentioned above in forming the second front side ILD material layer 46.

Figure 15A:
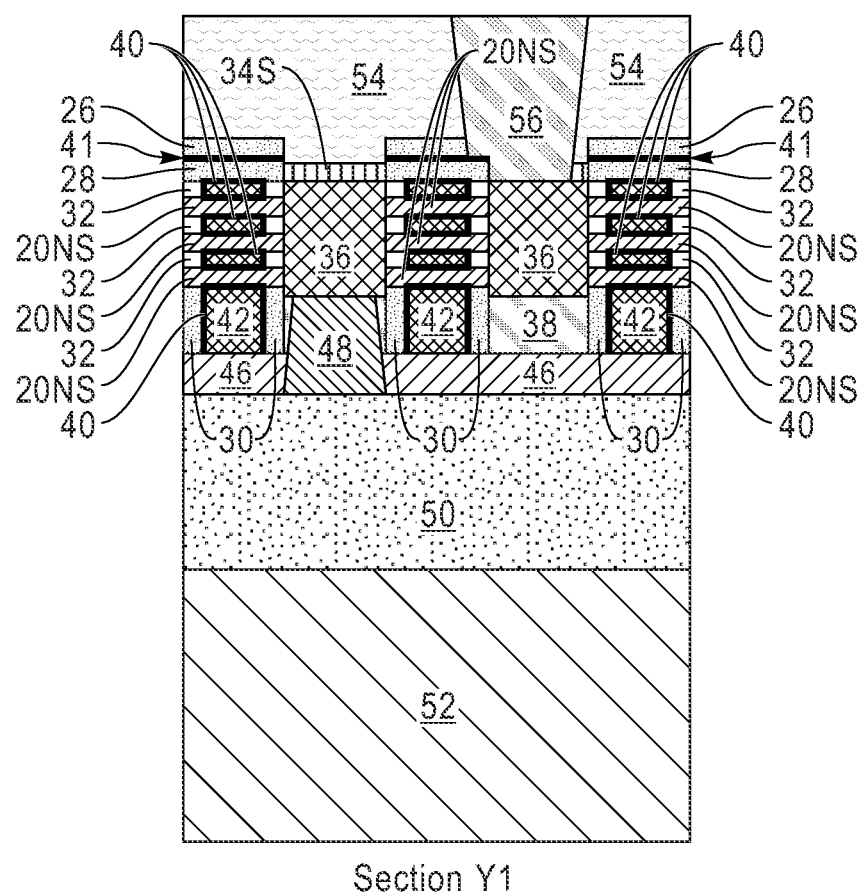
FIGS. 15A, 15B and 15C are cross sectional views of the exemplary structure shown in FIGS. 14A, 14B and 14C, respectively, after forming a self-aligned backside source/drain contact structure.
Figure 15C:
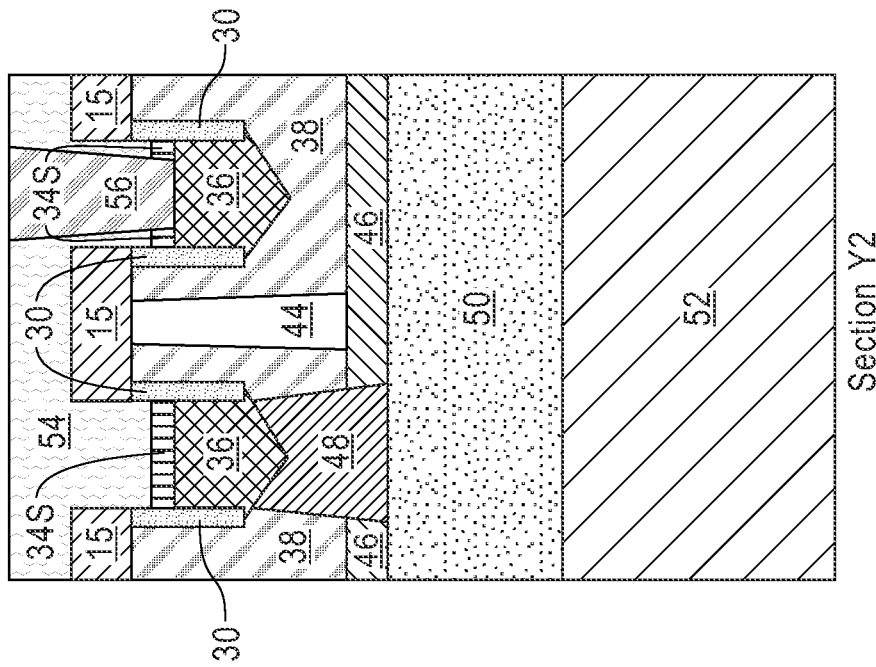
Figure 15B:
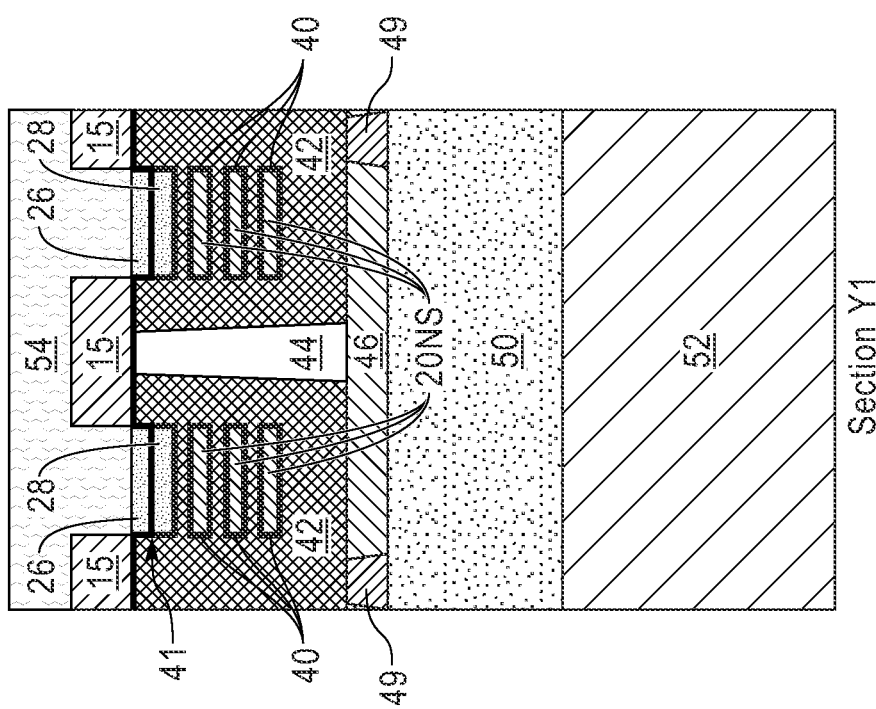

Referring now to FIGS. 15A, 15B and 15C, there are illustrated the exemplary structure shown in FIGS. 14A, 14B and 14C, respectively, after forming a self-aligned backside source/drain contact structure 56. The term "self-aligned" when used with the phrase "backside source/drain contact structure" denotes that this backside contact structure only connects to the source/drain region 36 without shorting to the nearby gate structure even if the contact structure physically overlaps with the gate structure. The self-aligned backside source/drain contact structure 56 is formed into the backside ILD material layer 54 and the recessed semiconductor buffer layer 34S. The self-aligned backside source/drain contact structure 56, in the flipped structure shown in FIGS. 15A and 15C, has a bottommost surface that is in direct physical contact with one of the source/drain regions. As is further shown in FIG. 15A, the self-aligned backside source/drain contact structure 56 overlaps, and contacts, the tri-layered bottom dielectric isolation structure 26/41/28 of the present application. Notably, the self-aligned backside source/drain contact structure 56 contacts a sidewall of first bottom dielectric isolation layer 26, a horizontal surface and a sidewall surface of the second bottom dielectric isolation layer (i.e., the high-k dielectric material) 41, and a sidewall surface of third bottom dielectric isolation layer 28.

The self-aligned backside source/drain contact structure 56 is formed utilizing a metallization process which includes forming a backside contact opening in the backside ILD material layer 54 and the recessed semiconductor buffer layer 34S and then filling the backside contact opening with at least one of the contact conductor materials mentioned above for the front side contact structures 48, 49. The self-aligned backside source/drain contact structure 56 can also include any of the liners mentioned above for the frontside contact structures 48, 49. The tri-layered bottom dielectric isolation structure 26/41/28 forms a protective cap structure over the gate structure, such that even if there is any corner loss during the etching of the backside ILD material layer 54, the self-aligned backside source/drain contact structure 56 would be still isolated from the gate structure.

Figure 16A:
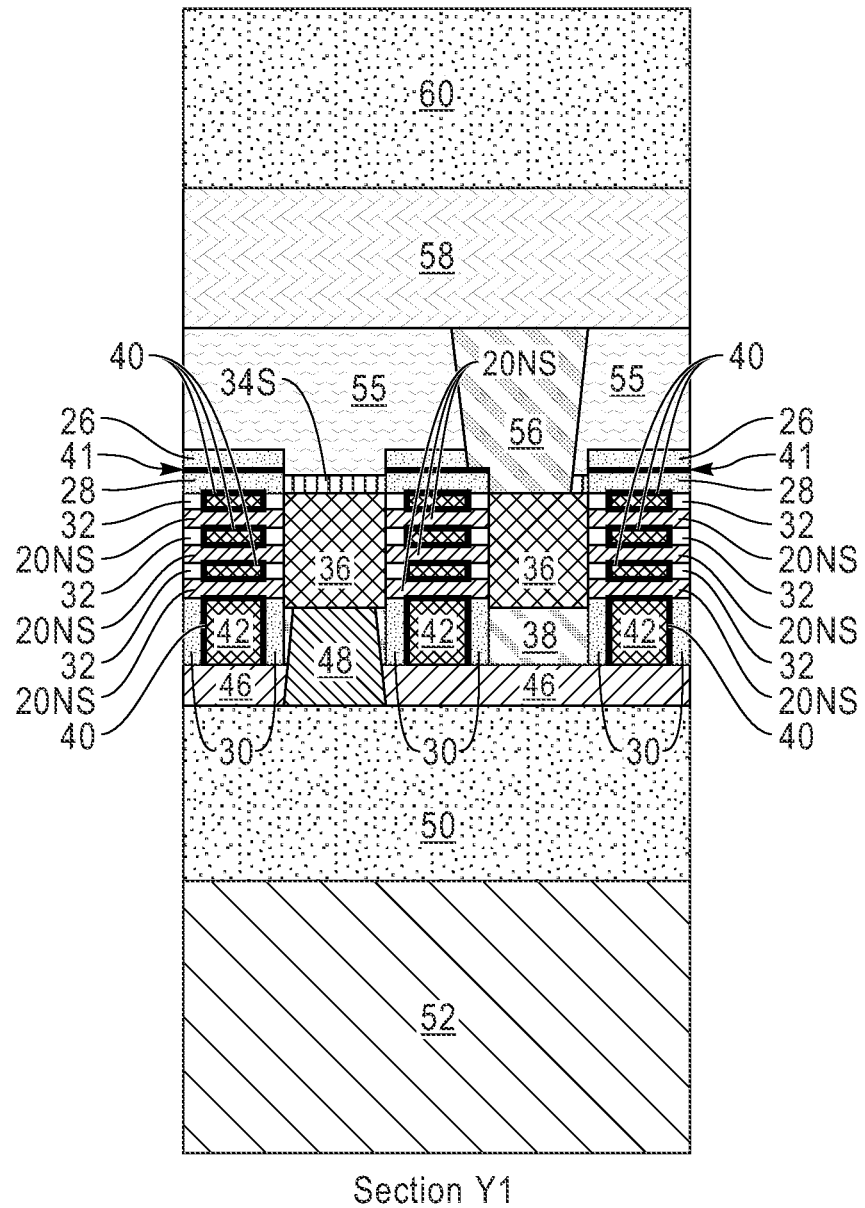
FIGS. 16A, 16B and 16C are cross sectional views of the exemplary structure shown in FIGS. 15A, 15B and 15C, respectively, after forming additional backside ILD material on the backside LID material layer and the self-aligned backside source/drain contact structure, and forming a backside power rail and a backside power distribution network.
Figure 16C:
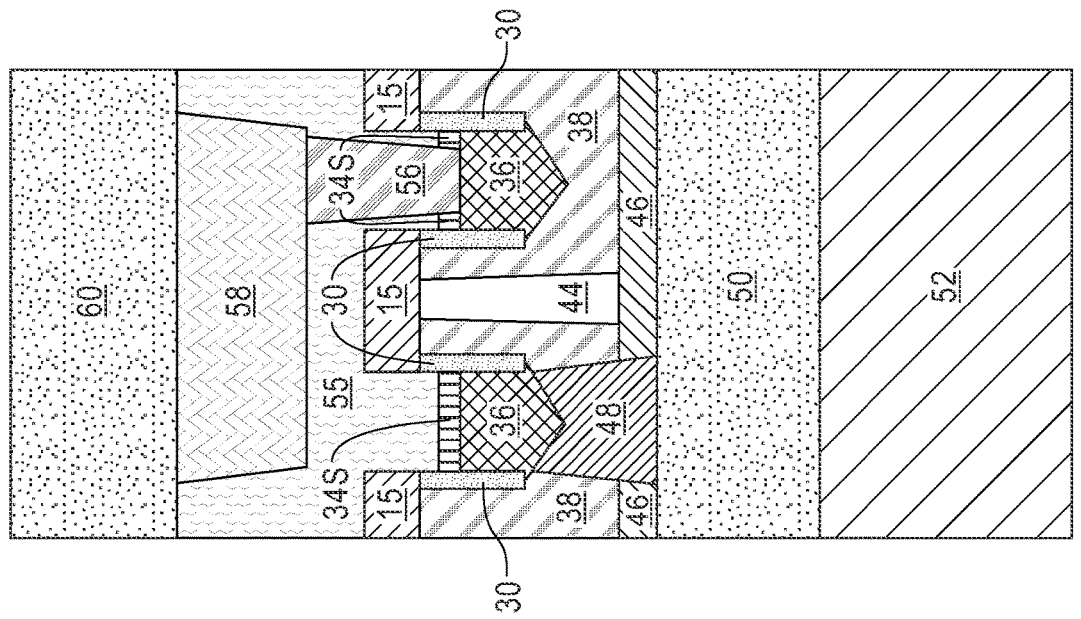
Figure 16B:
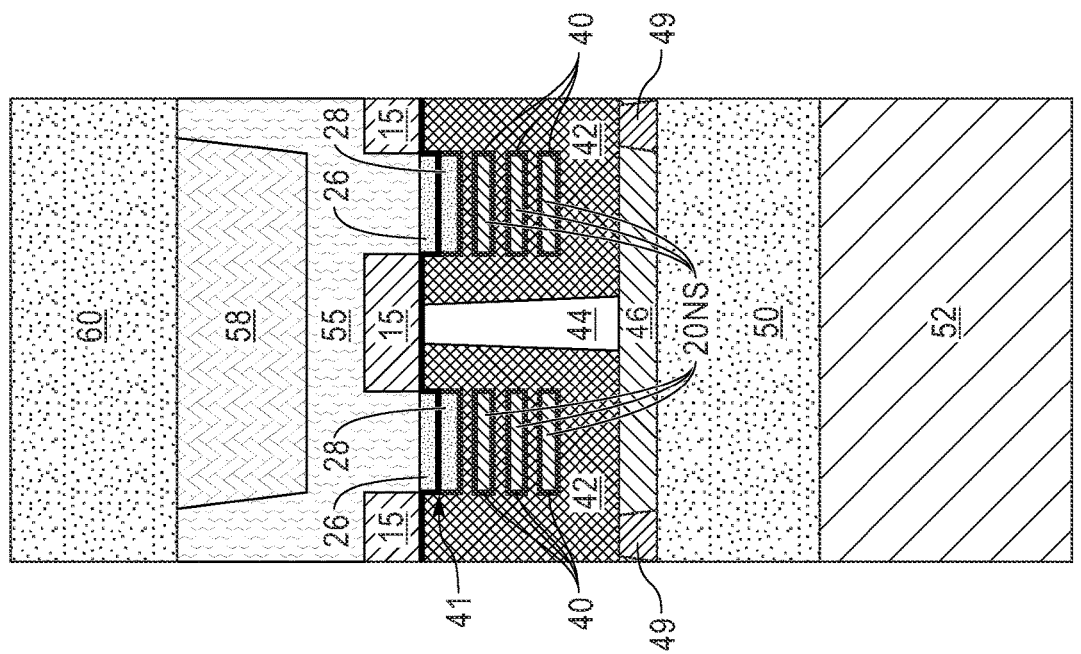

Referring now to FIGS. 16A, 16B and 16C, there are illustrated the exemplary structure shown in FIGS. 15A, 15B and 15C, respectively, after forming additional backside ILD material on the backside LID material layer 54 and the self-aligned backside source/drain contact structure 56, and forming a backside power rail 58 and a backside power distribution network 60. Collectively, the additional backside ILD material and the backside ILD material layer 54 form a multilayered backside ILD material structure 55. The additional backside material can include one of the dielectric materials mentioned above for the front side ILD material layer 46. The dielectric material that provides the additional backside ILD material can be compositionally the same as, or compositionally different from, the dielectric material that provides the backside ILD material layer 54. The additional backside ILD material can be formed utilizing one of the deposition processes mentioned above in forming the front side ILD material layer 46.

Backside power rail 58 is composed of any electrically conductive power rail material including, but not limited to, tungsten (W), cobalt (Co), ruthenium (Ru), aluminum (Al), copper (Cu), platinum (Pt), rhodium (Rh), or palladium (Pd), with a thin metal adhesion layer (such as TiN, TaN) typically being formed prior to the conductive metal deposition; for clarity, the metal adhesion layer is not separately illustrated in the drawings of the present application. The backside power rail 58 can be formed by forming a backside power rail opening in the multilayered backside ILD material structure 55; the backside power rail opening physically exposes a surface of the self-aligned backside source/drain contact structure 56. The backside power rail opening is then filled with at least one of the electrically conductive power rail materials mentioned above, and a planarization process can follow the filling of the backside power rail opening. The filling can include a CVD, PECVD, ALD, sputtering or plating. The resultant backside power rail 58 that is formed in the backside power rail opening is electrically connected to the source/drain regions 36 by the self-aligned backside source/drain contact structure 56.

Backside power distribution network 60 is formed on top of the multilayered backside ILD material structure 55 and on top of the backside power rail 58 that is embedded in the multilayered backside ILD material structure 55. Thus, the backside power distribution network 60 contacts the backside power rail 58. The backside power distribution network 60 includes elements/components that configured to distribute power to the transistors.

Notably, FIGS. 16A-16C illustrates a semiconductor structure in accordance with an embodiment of the present application. The illustrated structure includes a transistor (i.e., the middle one shown in FIG. 16A) including a gate structure 40, 42 and a first source/drain region located on a first side of the gate structure 40, 42 (i.e., the source/drain region 36 on the right hand side of the middle gate structure) and a second source/drain region located on a second side of the gate structure (i.e., the source/drain region 36 on the left hand side of the middle gate structure). The structure further includes a tri-layered bottom dielectric isolation structure 26, 41, 28 located beneath the transistor, a backside power rail 58 located beneath, and spaced apart from, the tri-layered bottom dielectric isolation structure 26, 41, 28, and a backside source/drain contact structure 56 connecting the backside power rail 58 to the first source/drain region of the transistor. In accordance with the present application, the backside source/drain contact structure 56 overlaps at least a portion of the tri-layered bottom dielectric isolation structure 26, 41, 28 (see, for example, FIG. 16A). The presence of the tri-layered bottom dielectric isolation structure 26, 41, 28 provides a thick dielectric cap that prevents the backside source/drain contact structure 56 from shorting the gate structure. In the prior art, bottom isolation structures are thin structures, typically less, than 10 nm, thus shorting between the gate structure and the backside source/drain contact structure can occur.

As mentioned above, the tri-layered bottom dielectric isolation structure 26, 41, 28 includes first bottom dielectric isolation layer 26, second bottom dielectric isolation layer 41 and third bottom dielectric isolation layer 28. As is illustrated in FIG. 16A, the backside source/drain contact structure 56 contacts a sidewall of the first bottom dielectric isolation layer 26, a horizontal surface and a sidewall surface of the second bottom dielectric isolation layer 41, and a sidewall of the third bottom dielectric isolation layer 28. Note that when the structure shown in FIG. 16A-16C is flipped 180° the gate electrode 42 is located above, and laterally adjacent to, the tri-layered bottom dielectric isolation structure 26, 41, 28.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A semiconductor structure comprising:
   a transistor comprising a gate structure and a first source/drain region located on a first side of the gate structure and a second source/drain region located on a second side of the gate structure;
   a tri-layered bottom dielectric isolation structure located beneath the transistor and comprising a first bottom dielectric isolation layer, a second bottom dielectric isolation layer and a third bottom dielectric isolation layer, wherein the third bottom dielectric isolation layer is positioned nearer to the transistor than the first bottom dielectric isolation layer;
   a backside power rail located beneath, and spaced apart from, the tri-layered bottom dielectric isolation structure; and
   a backside source/drain contact structure connecting the backside power rail to the first source/drain region of the transistor, wherein the backside source/drain contact structure overlaps at least a portion of the tri-layered bottom dielectric isolation structure and contacts a sidewall of the first bottom dielectric isolation layer, a horizontal surface and a sidewall surface of the second bottom dielectric isolation layer, and a sidewall of the third bottom dielectric isolation layer, wherein the horizontal surface of the second bottom dielectric isolation layer forms an interface with the first bottom dielectric isolation layer.

2. The semiconductor structure of claim 1, wherein the first bottom dielectric isolation layer and the third bottom dielectric isolation layer are both composed of a first dielectric material, and the second bottom dielectric isolation layer is composed of a second dielectric material that is compositionally different from the first dielectric material.

3. The semiconductor structure of claim 2, wherein the first dielectric material comprises a low-k spacer dielectric material, and the second dielectric material comprises a high-k gate dielectric material.

4. The semiconductor structure of claim 2, further comprising a gate spacer located on a sidewall of the gate structure, and wherein the gate spacer is composed of the first dielectric material.

5. The semiconductor structure of claim 2, wherein the gate structure comprises a gate dielectric material layer, wherein the gate dielectric material layer is composed of the second dielectric material.

6. The semiconductor structure of claim 2, wherein the backside source/drain contact structure contacts a sidewall of the first bottom dielectric isolation layer, a horizontal surface and a sidewall surface of the second bottom dielectric isolation layer, and a sidewall of the third bottom dielectric isolation layer.

7. The semiconductor structure of claim 1, further comprising a semiconductor buffer layer located on a surface of the first source/drain region, wherein the semiconductor buffer layer embeds a portion of the backside source/drain contact structure.

8. The semiconductor structure of claim 7, further comprising a multilayered backside interlayer dielectric material structure embedding another portion of the backside source/drain contact structure, wherein the multilayered backside interlayer dielectric material structure further embeds the backside power rail.

9. The semiconductor structure of claim 1, further comprising a backside power distribution network contacting the backside power rail.

10. The semiconductor structure of claim 1, further comprising a front side source/drain contact structure contacting the second source/drain region.

11. The semiconductor structure of claim 10, wherein the front side source/drain contact structure is embedded in a first front side interlayer dielectric material layer and a second front side interlayer dielectric material layer.

12. The semiconductor structure of claim 11, further comprising a front side gate contact structure located in the second front side interlayer dielectric material layer and contacting a gate electrode of the gate structure.

13. The semiconductor structure of claim 11, further comprising a front side back-end-of-the-line structure located on the second front side interlayer dielectric material layer, wherein the front side back-end-of-the-line structure is electrically connected to the second source/drain region by the front side source/drain contact structure.

14. The semiconductor structure of claim 13, further comprising a carrier wafer located on a surface of the front side back-end-of-the-line structure.

15. The semiconductor structure of claim 1, wherein the transistor is located on one side of a gate cut dielectric pillar.

16. The semiconductor structure of claim 1, wherein the transistor is a nanosheet transistor comprising a nanosheet stack of suspended semiconductor channel material nanosheets.

17. The semiconductor structure of claim 16, wherein the gate structure wraps around each of the suspended semiconductor material nanosheets.

18. A semiconductor structure comprising:
a transistor comprising a gate structure and a first source/drain region located on a first side of the gate structure and a second source/drain region located on a second side of the gate structure;
a tri-layered bottom dielectric isolation structure located beneath the transistor;
a backside power rail located beneath, and spaced apart from, the tri-layered bottom dielectric isolation structure; and
a backside source/drain contact structure connecting the backside power rail to the first source/drain region of the transistor, wherein the backside source/drain contact structure overlaps at least a portion of the tri-layered bottom dielectric isolation structure; wherein the gate structure includes a gate electrode that is located above, and laterally adjacent to, the tri-layered bottom dielectric isolation structure.

19. A semiconductor structure comprising:
a transistor comprising a gate structure and a first source/drain region located on a first side of the gate structure and a second source/drain region located on a second side of the gate structure;
a tri-layered bottom dielectric isolation structure located beneath the transistor;
a backside power rail located beneath, and spaced apart from, the tri-layered bottom dielectric isolation structure;
a backside source/drain contact structure connecting the backside power rail to the first source/drain region of the transistor, wherein the backside source/drain contact structure overlaps at least a portion of the tri-layered bottom dielectric isolation structure; and
a semiconductor buffer layer located on a surface of the first source/drain region, wherein the semiconductor buffer layer embeds a portion of the backside source/drain contact structure.

\* \* \* \* \*